(12) United States Patent
Nagai

(10) Patent No.: US 7,897,414 B2
(45) Date of Patent: Mar. 1, 2011

(54) METHOD OF MANUFACTURING SEMICONDUCTOR DEVICE AND THERMAL ANNEALING APPARATUS

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/350,238

(22) Filed: Jan. 8, 2009

(65) Prior Publication Data
US 2009/0181474 A1 Jul. 16, 2009

(30) Foreign Application Priority Data
Jan. 11, 2008 (JP) .............................. 2008-004602

(51) Int. Cl.
*H01L 21/00* (2006.01)
(52) U.S. Cl. .................... 438/3; 438/513; 438/663; 438/680; 257/E21.051; 257/E21.077; 257/E21.17; 257/E21.208; 257/E21.253; 257/E21.267; 257/E21.278; 257/E21.298; 257/E21.304; 257/E21.311; 257/E21.324; 257/E21.593; 257/E21.664

(58) Field of Classification Search ................ 438/3, 438/197, 238, 381, 513, 663, 680, 682, 692, 438/700, 721, 723, 724, 769, 679; 257/E21.17, 257/51, 77, 208, 253, 267, 278, 293, 311, 257/304, 324, 593, 646
See application file for complete search history.

(56) References Cited

U.S. PATENT DOCUMENTS

| | | | | |
|---|---|---|---|---|
| 5,736,422 A | * | 4/1998 | Lee et al. | 438/3 |
| 6,025,205 A | * | 2/2000 | Park et al. | 438/3 |
| 6,312,567 B1 | * | 11/2001 | Lee et al. | 204/192.15 |
| 6,653,212 B1 | * | 11/2003 | Yamanaka et al. | 438/485 |
| 6,843,201 B2 | | 1/2005 | Kuznetsov et al. | |

FOREIGN PATENT DOCUMENTS

| | | |
|---|---|---|
| JP | 11-171548 A | 6/1999 |
| JP | 11-195614 A | 7/1999 |
| JP | 2001-94064 A | 4/2001 |
| JP | 2004-134731 A | 4/2004 |
| JP | 2005-527972 A | 9/2005 |
| WO | WO03/085343 | 10/2003 |

* cited by examiner

*Primary Examiner*—David Nhu
(74) *Attorney, Agent, or Firm*—Fujitsu Patent Center

(57) ABSTRACT

A method of manufacturing a semiconductor device has forming a ferroelectric film over a substrate, placing the substrate having the ferroelectric film in a chamber substantially held in vacuum, introducing oxygen and an inert gas into the chamber, annealing the ferroelectric film in the chamber, and containing oxygen and the inert gas while the chamber is maintained sealed.

9 Claims, 17 Drawing Sheets

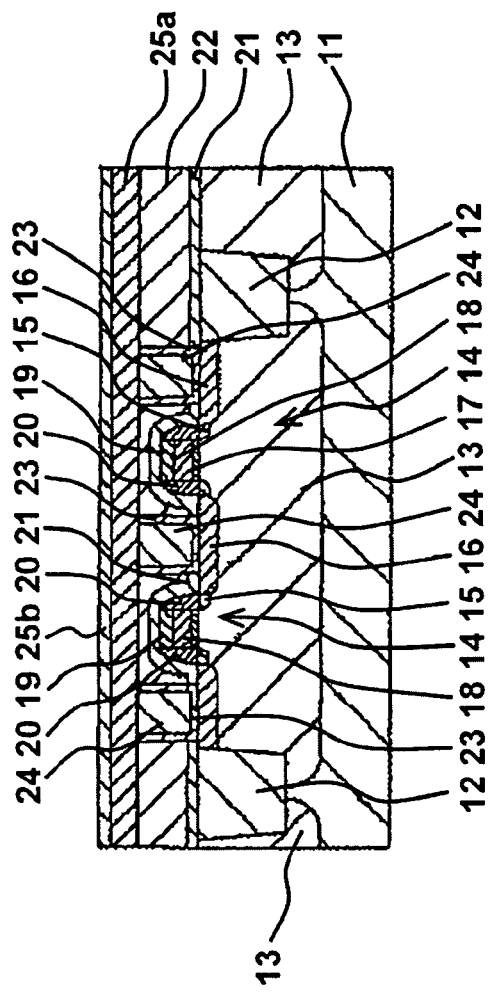
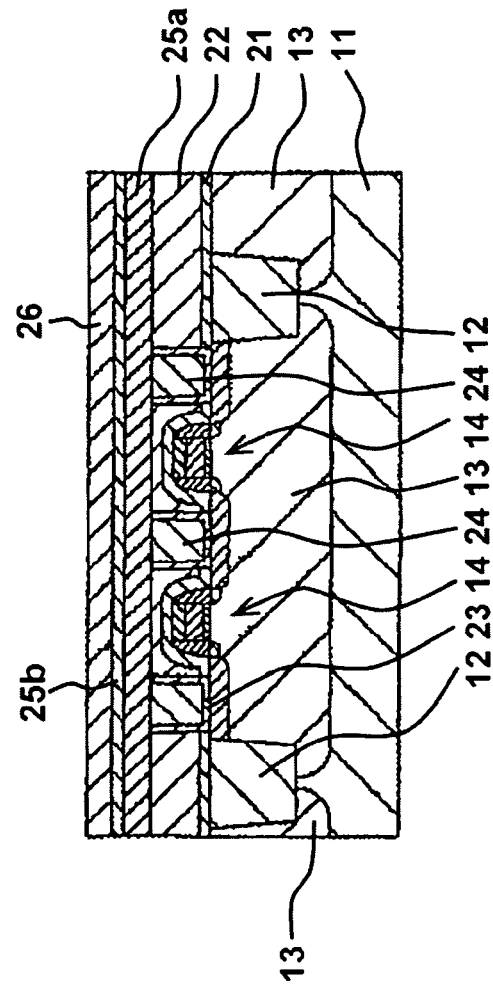
FIG.1A
FIG.1B

METHOD OF MANUFACTURING SEMICONDUCTOR DEVICE AND THERMAL ANNEALING APPARATUS

CROSS-REFERENCE TO RELATED APPLICATION

This application is based upon and claims the benefit of priority of the prior Japanese Patent Application No. 2008-004602 filed on Jan. 11, 2008, the entire contents of which are incorporated herein by reference.

BACKGROUND

1. Field

The embodiments discussed herein are directed to a method and a thermal annealing apparatus of manufacturing a semiconductor device.

2. Description of Related Art

Efforts have been made to develop ferroelectric random-access memories (FRAM) having improved device performance. The FRAM stores information at a ferroelectric capacitor by means of a polarization reversal of a ferroelectric material. The FRAM is a non-volatile memory that continuously stores information even when power is removed therefrom. The FRAM includes a ferroelectric capacitor that is composed of a ferroelectric film sandwiched between two electrodes.

Chiefly used as materials of the ferroelectric film forming the ferroelectric capacitor are ferroelectric oxides having perovskite crystalline structure, such as zirconate titanate $Pb(Zr, Ti)O_3$ (hereinafter referred to as PZT). In a typical production process, the ferroelectric film is formed using mainly physical vapor deposition (PVD) such as sputtering, and then subjected to a thermal annealing process for crystallization. For such a thermal annealing process, a thermal annealing apparatus is used. The thermal annealing apparatus heats a surface of a semiconductor wafer for a short period of time and then cools the semiconductor wafer.

Such a thermal annealing apparatus uniformly heats a semiconductor wafer at any temperature in the thermal annealing process subsequent to the PVD performed on the ferroelectric film. For example, Japanese Laid-open Patent Publication No. 11-195614 discloses one thermal annealing apparatus. Japanese Laid-open Patent Publication No. 11-171548 discloses another thermal annealing apparatus that performs the thermal annealing process on a ferroelectric film in an oxygen gas atmosphere in a thermal annealing chamber that is vacuumed and then supplied with an oxygen gas.

In accordance with Japanese Laid-open Patent Publication No. 11-195614, the temperature distribution of a semiconductor wafer is strictly controlled. A tube is arranged to introduce a gas into a thermal annealing chamber, but no detection means for detecting an oxygen concentration within the thermal annealing chamber is not arranged. The concentration distribution of the oxygen gas within the thermal annealing chamber may not be controlled. In accordance with Japanese Laid-open Patent Publication No. 11-171548, a certain amount of oxygen gas is introduced to reach a constant oxygen concentration of an oxygen atmosphere within the thermal annealing chamber in the thermal annealing process, and then the oxygen gas is only evacuated. For this reason, there take place variations in the oxygen concentrations in the vicinities of an oxygen supply pipe and an oxygen discharge pipe if one oxygen concentration is compared with the other oxygen concentration. If variations take place in the oxygen concentration, localized variations also take place in the supply amount of oxygen to an entire semiconductor wafer when the ferroelectric film is crystallized. Orientation of the ferroelectric film subsequent to the thermal annealing process on the semiconductor wafer may also suffer from localized variations.

SUMMARY

According to an aspect of an embodiment, a method of manufacturing a semiconductor device has forming a ferroelectric film over a substrate, placing the substrate having the ferroelectric film in a chamber substantially held in vacuum, introducing oxygen and an inert gas into the chamber, annealing the ferroelectric film in the chamber; and containing oxygen and the inert gas while the chamber is maintained sealed.

BRIEF DESCRIPTION OF THE DRAWINGS

FIGS. 1A and 1B are sectional views of a metal insulator semiconductor (MIS) transistor;

DESCRIPTION OF THE PREFERRED EMBODIMENTS

A method of manufacturing a semiconductor device and a thermal annealing apparatus in accordance with embodiments are described below. The embodiments are not limited to the embodiments described below.

A method of manufacturing a semiconductor device and a thermal annealing apparatus in accordance with a first embodiment are specifically described below in conjunction with the accompanying drawings.

During a thermal annealing process of a ferroelectric film, the thermal annealing apparatus of the first embodiment vacuums an enclosed thermal annealing chamber, and then introduces oxygen and argon gases into the thermal annealing chamber in a controlled fashion. The ferroelectric film may thus be annealed in an atmosphere of the thermal annealing chamber in which an oxygen concentration is controlled. The manufacturing method of the semiconductor device using the thermal annealing apparatus results in a uniform orientation in the ferroelectric film formed on a semiconductor wafer.

Figure 2:
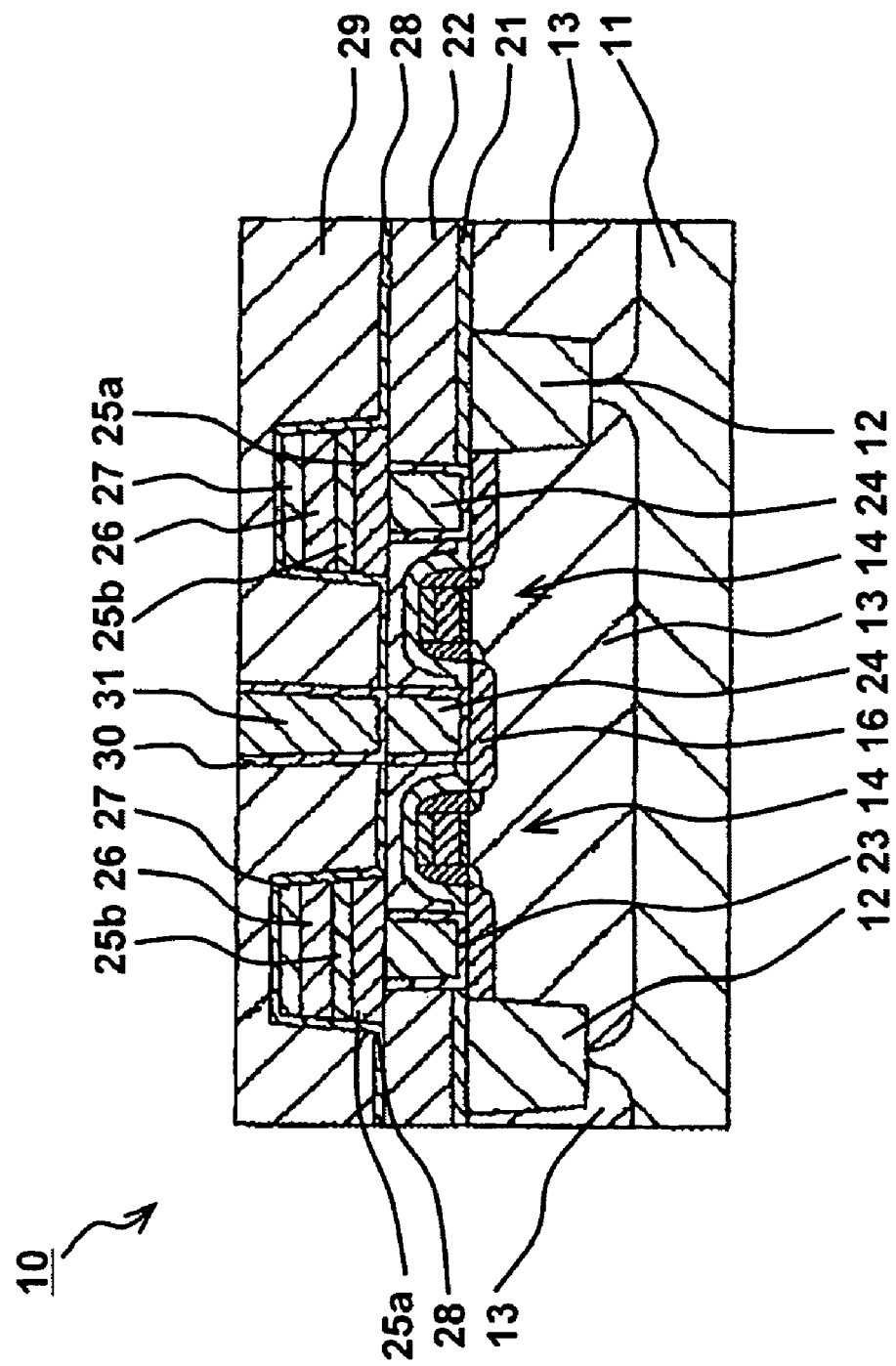
FIG. 2 illustrates a manufacturing process of the MIS transistor in accordance with one embodiment.

With reference to FIGS. 1A and 1B and FIG. 2, the method of manufacturing the semiconductor device having a ferroelectric capacitor in accordance with the first embodiment is described.

FIG. 1A is a sectional view illustrating a lower electrode of a ferroelectric capacitor formed on a metal insulator semiconductor (MIS) transistor 14. The ferroelectric capacitor having the sectional structure of FIG. 1A is manufactured as described below.

Referring to FIG. 1A, a shallow trench isolation (STI) is formed as a device isolation region 12 on a semiconductor substrate 11 made of silicon, in a known process.

Wells 13 of types corresponding to a region where a P-type MIS transistor is to be formed, and a region where an N-type MIS transistor is to be formed are formed in the semiconductor substrate 11 in a known process.

A gate insulator 17, a gate electrode 18, a silicide layer 19, a lightly-doped diffusion layer 15, a sidewall 20, and a heavily-doped diffusion layer 16 are formed on the well 13 in a known process, thereby resulting in a MIS transistor 14.

The heavily-doped diffusion layer 16 between the MIS transistors 14 is shared by the MIS transistors 14.

Using a chemical vapor deposition (CVD) method, a silicon nitride layer 21 is formed to cover entirely the MIS transistors 14. A silicon dioxide layer 22 is entirely formed using the CVD method and then the formed silicon dioxide layer 22 is planarized by repeating a chemical mechanical polishing method. To remove moisture remaining in the silicon dioxide layer 22, a thermal annealing is performed.

A contact hole forming a plug to be connected to each heavily-doped diffusion layer 16 is penetrated through the silicon dioxide layer 22 and the silicon nitride layer 21.

A lamination layer made of a titanium nitride (TiN) layer and a titanium (Ti) layer is formed as a filling layer 23 in the contact hole using physical vapor deposition (PVD) method. A tungsten (W) layer is embedded within the lamination layer covered contact hole using the CVD method. By planarizing the lamination layer using the CMP method, a tungsten plug 24 is formed.

A phosphorus-silicon oxynitride (P—SiON) layer (not shown) is formed to a thickness in the range from 130 nm to 170 nm using the CVD method as an anti-oxidation layer for the tungsten plug 24.

An aluminum oxide (AlO) layer 25a is entirely formed using the PVD method. After the aluminum oxide (AlO) layer 25a is formed, a rapid thermal annealing (RTA) apparatus performs a thermal annealing operation. The thermal annealing process corrects oxygen vacancies in the crystal of the aluminum oxide (AlO) layer 25a. Since the thermal annealing operation compensates for oxygen vacancies in the crystal of the aluminum oxide (AlO) layer 25a, orientation is also improved in a platinum (Pt) layer 25b serving as a lower electrode of the ferroelectric capacitor to be discussed later.

The platinum layer 25b is formed to within a thickness in a range about from 100 nm to 200 nm on the aluminum oxide (AlO) layer 25a using the PVD method. The platinum layer 25b is formed to be the lower electrode of the ferroelectric capacitor. The platinum layer 25b is formed in orientation (111) so that a zirconate titanate (PZT) layer 26 to be formed on the platinum layer 25b is aligned with orientation (111).

FIG. 1B illustrates an operation for forming a ferroelectric film of the ferroelectric capacitor. As shown in FIG. 1B, the PZT layer 26 is formed to within a thickness in a range from about 150 nm to 300 nm on the platinum layer 25b using the PVD method. Alternatively, the PZT layer 26 may be formed using a sol-gel process. As for the composition of the PZT layer 26, lead (Pb) is excessively higher in concentration than each of zirconium (Zr) and titanium (Ti). Let [Pb], [Zr] and [Ti] represent the concentrations of lead, zirconium and titanium, and an inequality [Pb]/([Zr]+[Ti])>1 holds. With the inequality held true, the PZT layer 26 is aligned with orientation (111). In this operation, the PZT layer 26 is formed in an amorphous structure on the platinum layer 25b. The PZT layer 26 may be formed on the semiconductor substrate 11, or the PZT layer 26 may be formed over the semiconductor substrate via the aluminum oxide layer 25a and/or the platinum layer 25b.

Subsequent to the formation of the PZT layer 26, the PZT layer 26 is annealed for crystallization. The RTA apparatus performs the thermal annealing operation in an enclosed atmosphere of oxygen and argon gases with a ratio of the oxygen gas to the argon gas being in a range from about 1:30 to about 1:40 at a temperature in a range from about 500° C. to about 600° C. for about 90 seconds. More preferably, the temperature range of the thermal annealing operation is in a range from about 550° C. to 570° C. Through the thermal annealing operation (crystallization annealing), the crystallization of the PZT layer 26 starts with the side thereof to the platinum layer 25b serving as the lower electrode.

The RTA apparatus used in the thermal annealing operation will be described later. The thermal annealing operation is carried out in the enclosed atmosphere in which the volume ratio of oxygen gas to argon gas is controlled.

FIG. 2 illustrates an operation of forming an inter-layer insulator 29 and a contact plug 31 subsequent to the formation of an upper electrode 27 on the PZT layer 26 in a known process.

As shown in FIG. 2, an iridium oxide (IrOx) layer 27 is deposited to a thickness of about 50 nm on the PZT layer 26 using the PVD method.

After the iridium oxide layer 27 is formed on the PZT layer 26, the RTA apparatus performs the thermal annealing operation. The thermal annealing operation is performed so that defects caused in the PZT layer 26 in the formation of the iridium oxide layer 27 or in another operation are corrected and so that iridium (Ir) in the iridium oxide layer 27 is diffused into the PZT layer 26.

The iridium oxide layer 27 is then again deposited to a thickness of about 200 nm using the PVD method. The iridium oxide layer 27 is again subjected to the thermal annealing operation.

A photolithography operation and an etching operation are then performed, thereby patterning the aluminum oxide layer 25a, the platinum layer 25b, the PZT layer 26, and the iridium oxide layer 27. Through these operations, the iridium oxide layer 27 becomes the upper electrode, and the platinum layer 25b becomes the lower electrode. The ferroelectric capacitor in a stack structure is thus formed of the upper electrode and the lower electrode and the PZT layer 26 sandwiched therebetween.

An alumina protective layer 28 is deposited using the CVD method to cover entirely the ferroelectric capacitor.

An inter-layer insulator 29 is formed on the entire surface of the alumina protective layer 28 using the CVD method, and then planarized using the CMP method.

A contact hole reaching the tungsten plug 24 is drilled through the inter-layer insulator 29 and the alumina protective layer 28 using patterning and etching method. The contact hole is connected to the heavily-doped diffusion layer 16 that is shared by a plurality of MIS transistors 14.

A titanium nitride (TiN) layer is formed as a filling layer 30 within the contact hole. A tungsten (W) layer is then embedded in the contact hole using the CVD method, for example. A contact plug 31 is formed by planarizing the tungsten layer through the CMP method.

The above-described operations complete the formation of main ferroelectric capacitor layers. Wiring layers are then formed. In succession, a passivation layer, made of one of an oxide layer (P—SiO layer), an oxynitride layer (P—SiO layer), and a polyimide layer (PI layer) for protecting the MIS transistor 14 and the ferroelectric capacitor is formed, thereby completing the manufacturing of a semiconductor device 10.

The stack type capacitor has been discussed in connection with the first embodiment. The first embodiment is also applicable to a planar-type capacitor.

Figure 3:
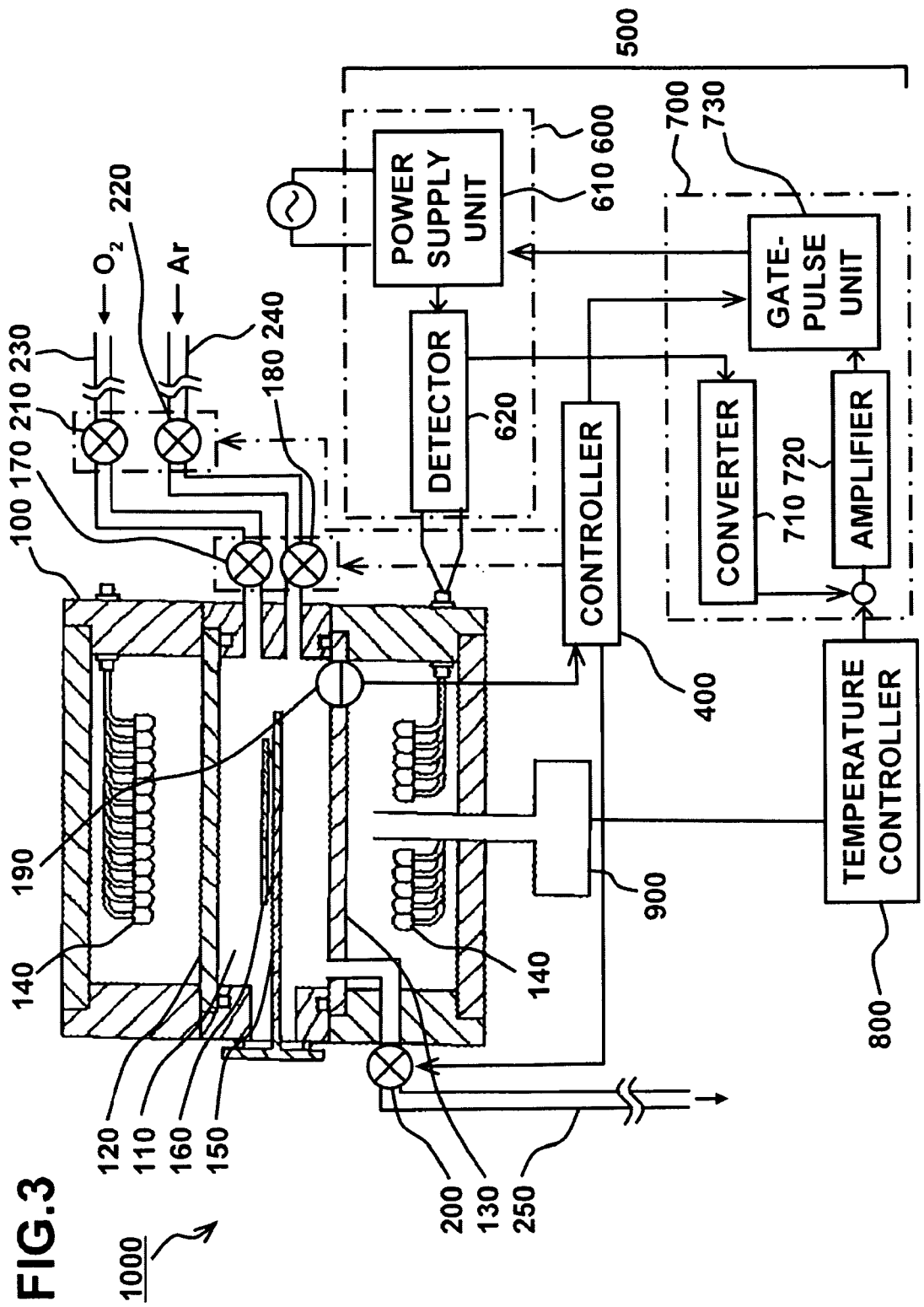
FIG. 3 illustrates a thermal annealing apparatus in accordance with a first embodiment.

FIG. 3 illustrates the entire structure of a thermal annealing apparatus 1000 of the first embodiment. As shown in FIG. 3, the thermal annealing apparatus 1000 includes an apparatus housing 100, a controller 400, and a dose setting device 500.

As shown in FIG. 3, the apparatus housing 100 is divided into three compartments from top to bottom by quartz glass plates 120 and 130 arranged in parallel. Top and bottom compartments are provided with a plurality of halogen lamps 140 emitting infrared light. An intermediate compartment is a thermal annealing chamber 110. The thermal annealing chamber 110 is an enclosed chamber in which a semiconductor wafer 160 as a sample to be heated, supported by a support arm 150, is annealed. An O-ring (not shown) is arranged between facing surfaces of the thermal annealing chamber 110 and the support arm 150 in order to seal the thermal annealing chamber 110. The thermal annealing chamber 110 is sealed after the semiconductor wafer 160 is introduced therein. A discharge gate valve 250 evacuates the air from inside the thermal annealing chamber 110. An oxygen supply valve 230 and an argon supply valve 240 respectively supply an oxygen gas and an argon gas into the thermal annealing chamber 110.

The semiconductor wafer 160 has a round shape. A large number of halogen lamps 140 are arranged to face the semiconductor wafer 160 in order to illuminate the entire surface of the semiconductor wafer 160. The halogen lamps 140 functioning as a heating unit are arranged on both sides of the thermal annealing chamber 110. In accordance with the first embodiment, the upper and lower halogen lamps 140 are divided into three concentric circular zones with respect to the surfaces of the semiconductor wafer 160. A power supply 600 and a power supply controller 700 are arranged for each concentric circular zone. FIG. 3 illustrates the power supply 600 and the power supply controller 700 for one zone only. It is noted that the halogen lamps 140 may be arranged with respect to only one side of the thermal annealing chamber 110.

Referring to FIG. 3, each halogen lamp 140 is connected to the dose setting device 500 external to the apparatus housing 100 via a wiring penetrating through the wall of the apparatus housing 100.

The dose setting device 500 includes the power supply 600, the power supply controller 700, a temperature controller 800, and a radiation temperature meter 900. A single radiation temperature meter 900 is arranged on the housing bottom wall of the apparatus housing 100 to measure the temperature at the center of the semiconductor wafer 160.

The temperature controller 800 compares the temperature measured by the radiation temperature meter 900 with a temperature set at the center zone. A thyristor in a power supply unit 610 in the power supply 600 is driven by an amplifier 720 and a gate-pulse unit 730 in the power supply controller 700 so that a difference between a set temperature and a center zone temperature becomes zero. A supplied current value from the power supply unit 610 to the halogen lamps 140 is fed back by the detector 620 via a converter 710 in the power supply controller 700. The power supply controller 700 drives the thyristor in the power supply unit 610 in response to information of the supplied current value fed back in order to maintain the temperature set by the temperature controller 800. The gate-pulse unit 730 drives the thyristor in the power supply unit 610 to heat the semiconductor wafer 160 as the sample to be heated, in accordance with detected information related to an overall pressure of the oxygen gas and the argon gas provided by a pressure sensor 190 to be discussed later.

Power is feed-back controlled for each of the remaining zones. The power values are set as below. A thermocouple is fixed to a predetermined position corresponding to each zone on a dummy wafer that is made of a nickel plate or a stainless steel plate. Under this setting, the halogen lamps 140 are lit, and the ratio of power setting values is determined so that the temperature of each zone is substantially equal to the temperature at the center zone.

The apparatus housing 100 includes an oxygen supply pipe 230 for introducing an oxygen gas into the thermal annealing chamber 110, an argon supply pipe 240 for introducing an argon gas into the thermal annealing chamber 110, a discharge pipe 250 for discharging the oxygen gas and the argon gas, and the pressure sensor 190 for measuring the overall internal pressure of the oxygen gas and argon gas in the thermal annealing chamber 110. The oxygen supply pipe 230 includes an oxygen flow control valve 210 for controlling an inflow rate of the oxygen gas to within a range from about 0.010 to about 0.150 (liter/minute) and an oxygen gate valve 170 for controlling the supply of the oxygen gas into the thermal annealing chamber 110. The oxygen gate valve 170 is arranged between the thermal annealing chamber 110 and the oxygen flow control valve 210. In the gas supply operation, the inflow rate of the oxygen gas is preferably about 0.055 (liter/minute). The argon supply pipe 240 includes an argon flow control valve 220 for controlling an inflow rate of the argon gas to within a range from about 1.990 to about 1.850 (liters/minute) and an argon gate valve 180 for controlling the supply of the argon gas into the thermal annealing chamber 110. The argon gate valve 180 is arranged between the thermal annealing chamber 110 and the argon flow control valve 220. The inflow rate of the argon gas is preferably about 1.95 (liters/minute). The discharge pipe 250 is provided with a discharge gate valve 200 for controlling the discharging of the oxygen and argon gases.

The discharge gate valve 200 is opened to vacuum the thermal annealing chamber 110 and closed to seal the thermal annealing chamber 110. The oxygen gate valve 170 and the argon gate valve 180 are opened by the controller 400 until the pressure sensor 190 shows 1 atmosphere, i.e., until the internal pressure of the thermal annealing chamber 110 becomes 1 atmosphere. In other words, the oxygen gate valve 170 and the argon gate valve 180 are closed when the oxygen and argon gases introduced reach an internal pressure level of 1 atmosphere in the thermal annealing chamber 110.

In accordance with pressure information relating to the internal pressure of the thermal annealing chamber 110 from the pressure sensor 190, the controller 400 controls the oxygen gate valve 170, the argon gate valve 180, the discharge gate valve 200, the oxygen flow control valve 210, and the argon flow control valve 220 for opening and closing, and controls the gate-pulse unit 730 for driving.

Figure 4:
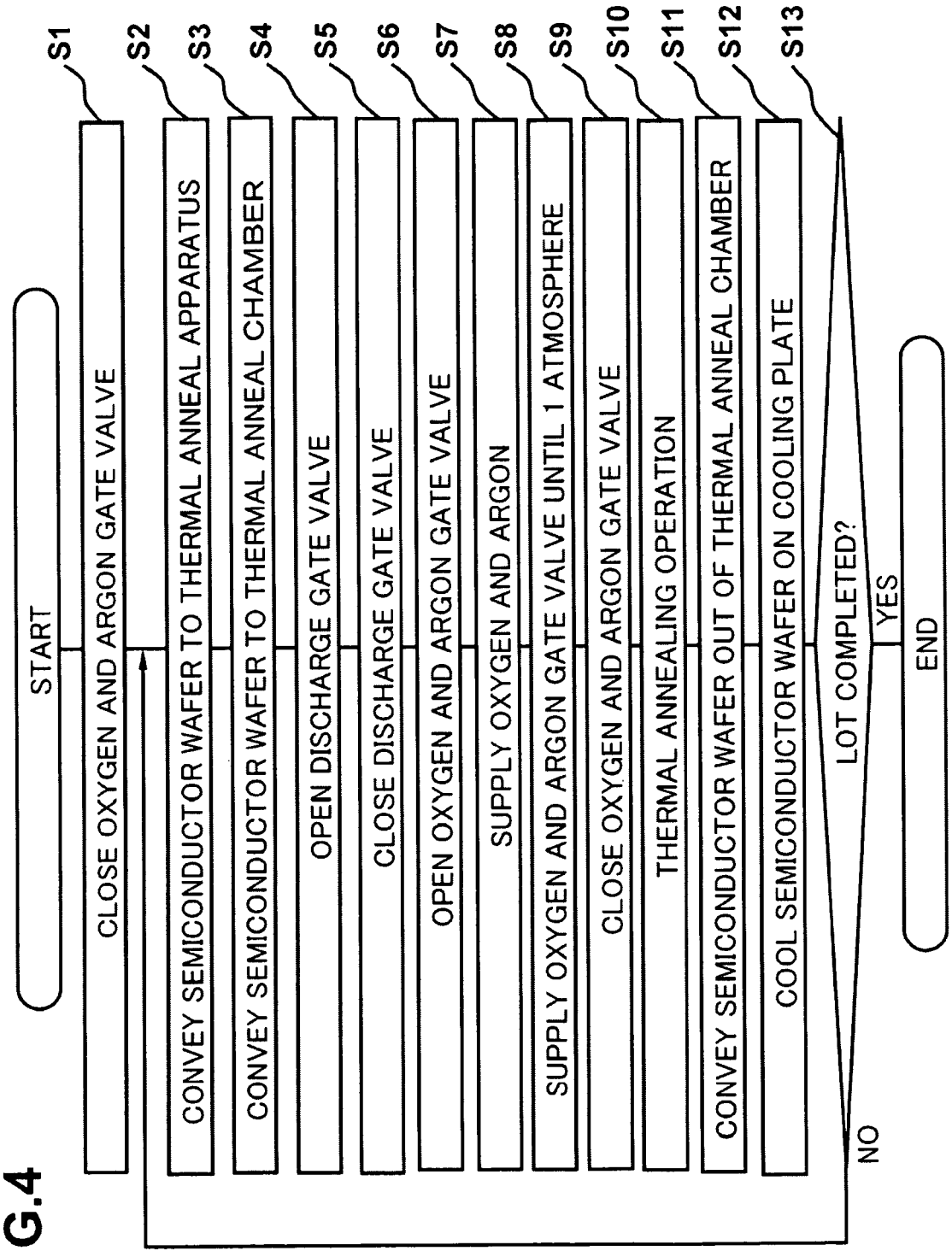
FIG. 4 is a flowchart illustrating of a thermal annealing process of a semiconductor device in accordance with the first embodiment.

FIG. 4 is a flowchart illustrating a thermal annealing process of the semiconductor device 10 performed by the thermal annealing apparatus 1000 in accordance with the first embodiment. First, the controller 400 closes the oxygen gate valve 170 and the argon gate valve 180 (S1). The semiconductor wafer 160 is conveyed to the thermal annealing apparatus 1000 (S2). The semiconductor wafer 160 is mounted on the support arm 150 and then introduced into the thermal annealing chamber 110 of the apparatus housing 100 (S3). The controller 400 opens the discharge gate valve 200 and then vacuums the thermal annealing chamber 110 with a vacuum pump (not shown) (S4). The vacuuming operation is performed until the internal pressure of the thermal annealing chamber 110 reaches about $1.0 \times 10^{-1}$ (Pa). In the vacuuming operation, the pressure sensor 190 measures the internal pressure of the thermal annealing chamber 110. The vacuum operation is performed to evacuate gases from within the thermal annealing chamber 110. The controller 400 closes the discharge gate valve 200, thereby sealing the thermal annealing chamber 110 and maintaining a substantially vacuum state in the thermal annealing chamber 110 (S5). The controller 400 opens the oxygen gate valve 170 and the argon gate valve 180 (S6). The controller 400 opens the oxygen flow control valve 210 and the argon flow control valve 220, thereby supplying an oxygen gas and an argon gas into the thermal annealing chamber 110 via the oxygen supply pipe 230 and the argon supply pipe 240 respectively (S7). In this operation, the inflow rate of oxygen gas is in a range from about 0.010 to about 0.150 (liter/minute), and the inflow rate of argon gas is in a range from about 1.990 to about 1.850 (liters/minute). The ratio of oxygen gas to argon gas within the thermal annealing chamber 110 is preferably in a range from about 1:30 to about 1:40. To achieve test results illustrated in FIGS. 6A and 6B and FIG. 7, the inflow rate of oxygen gas to the thermal annealing chamber 110 is set to be about 0.055 (liter/minute) and the inflow rate of argon gas to the thermal annealing chamber 110 is set to be about 1.95 (liters/minute). The controller 400 continuously supplies the oxygen gas and argon gas into the thermal annealing chamber 110 until the internal pressure of the thermal annealing chamber 110 reaches about 1 atmosphere (S8). During a thermal annealing operation to be discussed later, the internal pressure of the thermal annealing chamber 110 rises due to dilation of the internal gases. The pressure sensor 190 only measures the internal pressure prior to the thermal annealing operation. The controller 400 closes the oxygen gate valve 170, the argon gate valve 180, the oxygen flow control valve 210, and the argon flow control valve 220, thereby maintaining the volume ratio of oxygen gas to argon gas to a substantially constant value within the thermal annealing chamber 110 (S9). The controller 400 performs the thermal annealing operation on the semiconductor wafer 160 based on internal pressure information related to the internal pressure in the thermal annealing chamber 110 measured by the pressure sensor 190 (S10). The thermal annealing operation is performed within a temperature range from about 500° C. to about 600° C. for about 90 seconds. Subsequent to the thermal annealing operation, the semiconductor wafer 160 is conveyed out of the thermal annealing chamber 110 by the support arm 150 (S11). The semiconductor wafer 160 is mounted on a cooling plate (not shown), and then left naturally cooled down to about 350° C. for about 5 minutes (S12). The thermal annealing process is repeated on semiconductor wafers 160 until a full manufacturing lot is completed (S13).

Figure 5:
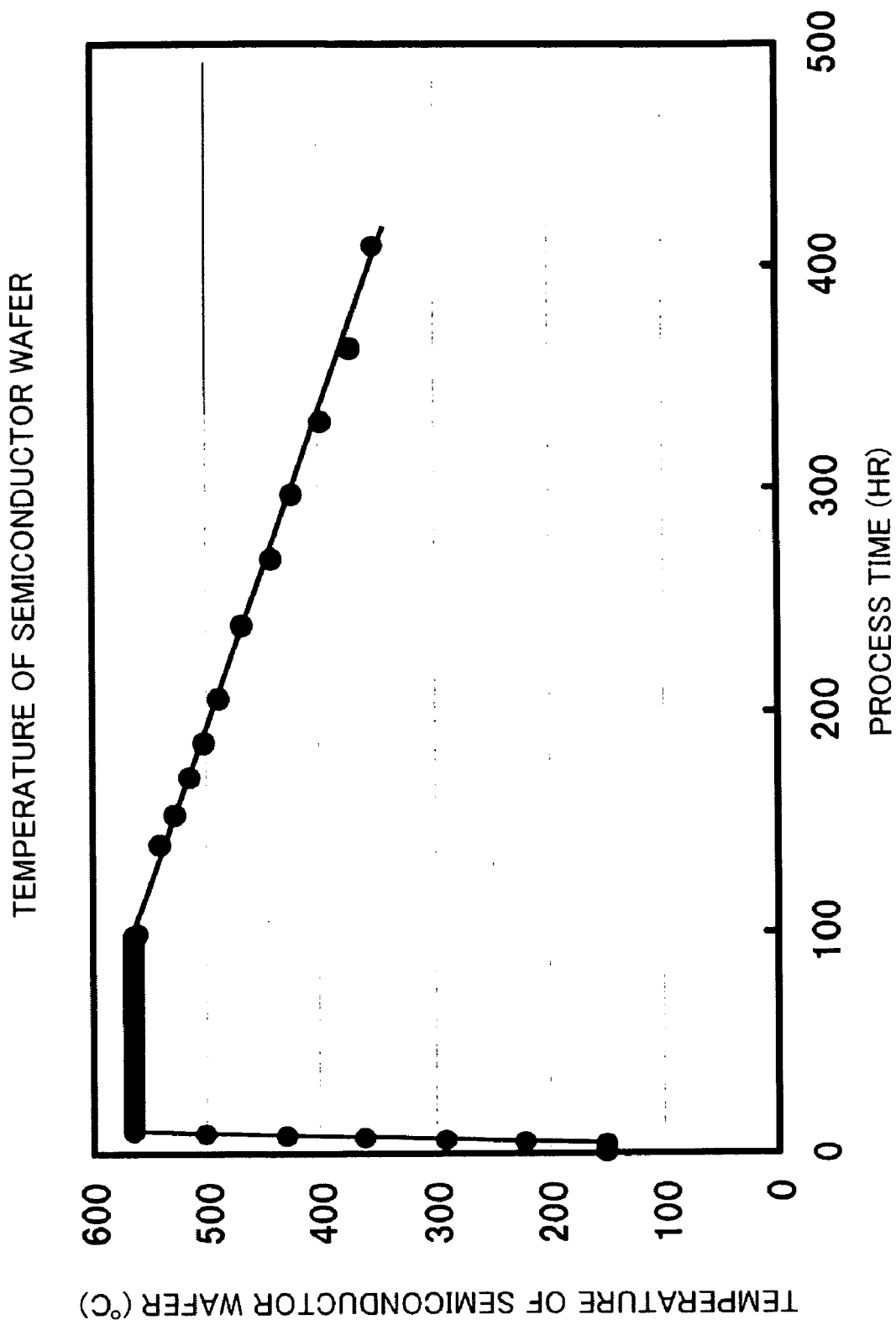
FIG. 5 illustrates a temperature profile of a semiconductor wafer in accordance with the first embodiment.

FIG. 5 illustrates a relationship between a process time of the thermal annealing process of the semiconductor device 10 of FIG. 2 and a temperature of the semiconductor wafer 160 in accordance with the first embodiment. The semiconductor wafer 160 is heated in the thermal annealing chamber 110 of the thermal annealing apparatus 1000 from about 150° C. to within a range from about 560° C. to about 565° C. in about 10 seconds. Then, the semiconductor wafer 160 is maintained to within a temperature range from about 560° C. to about 565° C. for about 90 seconds, within which the PZT layer 26 is crystallized. The semiconductor wafer 160 is naturally left cooled down to about 410° C. for about 5 minutes. The semiconductor wafer 160 is conveyed on the cooling plate and then cooled.

Figure 6B:
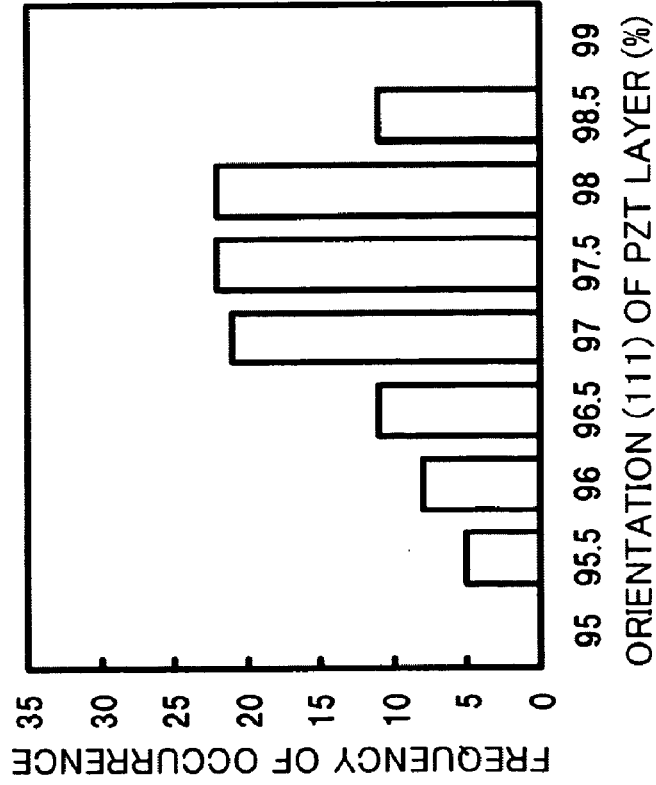
FIG. 6A illustrates a PZT orientation distribution of a known semiconductor device and FIG. 6B illustrates a PZT orientation distribution of the semiconductor device of the first embodiment.
Figure 6A:
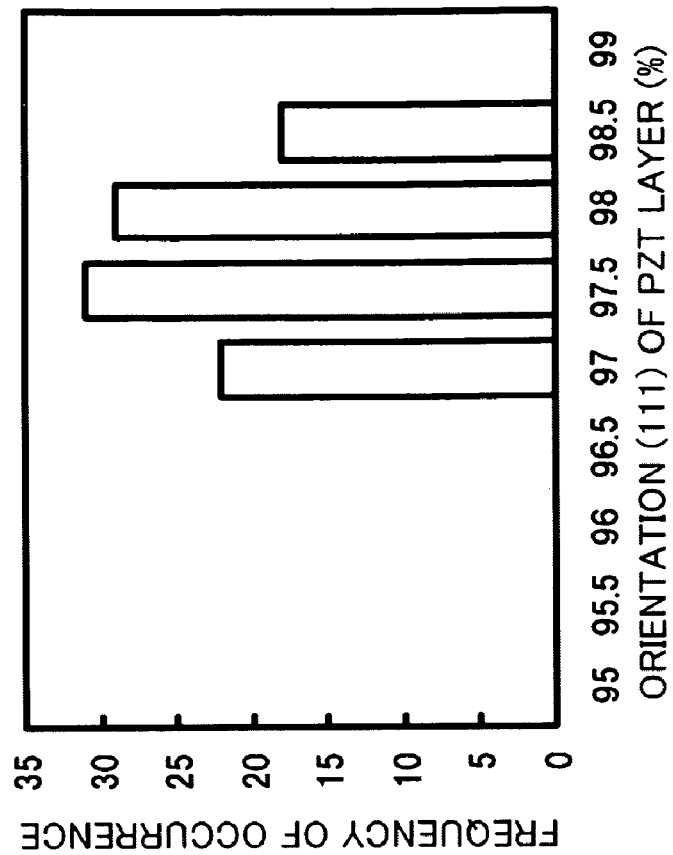

FIGS. 6A and 6B illustrate the orientation (111) of the PZT layer 26 and the frequency of occurrence thereof in the semiconductor device 10 having the PZT layer 26 that has been crystallized using an ordinary thermal annealing apparatus and in the semiconductor device 10 having the PZT layer 26 of the first embodiment.

In FIG. 6A, the abscissa represents the orientation (111) of the PZT layer 26 (%) and the ordinate represents the frequency of occurrence of the orientation (111) of the PZT layer 26. More specifically, the semiconductor devices 10 were manufactured by annealing 100 semiconductor wafers 160 using a known thermal annealing apparatus. FIG. 6A is thus a histogram representing the frequency of occurrence of the orientation (111) of the PZT layer 26. The inflow rate of oxygen gas into the thermal annealing chamber was set to be about 0.055 (liter/minute), and the inflow rate of argon gas into the thermal annealing chamber was set to be about 1.95 (liters/minute). Oxygen gas and argon gas were introduced at the above-described constant rates into the thermal annealing chamber, and the oxygen gas and argon gas introduced were then discharged. The larger, the orientation (111) of the PZT layer 26, the more the crystal components contributing to polarization result. The larger the orientation (111), the better.

FIG. 6A shows that if the semiconductor devices 10 are produced by annealing 100 semiconductor wafers 160, 15% of the semiconductor devices 10 produced have the orientation (111) of the PZT layer 26 within a range about 95% to 96%.

The chamber atmosphere of the known thermal annealing apparatus in the thermal annealing operation is adjusted by introducing the oxygen gas and argon gas into the thermal annealing chamber at the controlled inflow rates and then discharging the oxygen gas and argon gas out of the thermal annealing chamber. However, variations occur in the oxygen concentration if the oxygen concentrations in the vicinities of the oxygen supply pipe and the argon supply pipe are compared with the oxygen concentration in the vicinity of the discharge. Such variations are considered to lead to variations in the locations of occurrence of the orientation (111) of the PZT layer 26 on the wafer subsequent to the thermal annealing operation.

FIG. 6B illustrates the orientation (111) of the PZT layer 26 in the semiconductor device 10 of the first embodiment and the frequency of occurrences of the orientation (111). In FIG. 6, the abscissa represents the orientation (111) (%) of the PZT layer 26 and the ordinate represents the frequency of occurrences of the orientation (111) of the PZT layer 26. FIG. 6B is thus a histogram representing the frequency of occurrences of the orientation (111) of the PZT layer 26 obtained when the semiconductor devices 10 are manufactured by annealing 100 semiconductor wafers 160 in accordance with the first embodiment. The larger the orientation (111) of the PZT layer 26, the more the crystal components contributing to polarization result. The larger the orientation (111), the better.

FIG. 6B shows that if the semiconductor devices 10 are produced by annealing 100 semiconductor wafers 160, all the semiconductor wafers 160 have the PZT layers 26 of an orientation (111) of 97% or higher. If the thermal annealing operation is performed in the closed atmosphere in accordance with the first embodiment, the volume ratio of oxygen gas to argon gas may be controlled at a substantially constant level in the vicinity of each location of the oxygen supply pipe 230, the argon supply pipe 240 and the discharge pipe 250 in the thermal annealing chamber 110. Variations in the distribution of the oxygen gas and argon gas on the semiconductor wafer 160 are prevented as much as possible. In comparison with the known thermal annealing apparatus, manufacturing variations in the orientation (111) of the PZT layer 26 on the semiconductor devices 10 are substantially reduced in accordance with the first embodiment.

Figure 7:
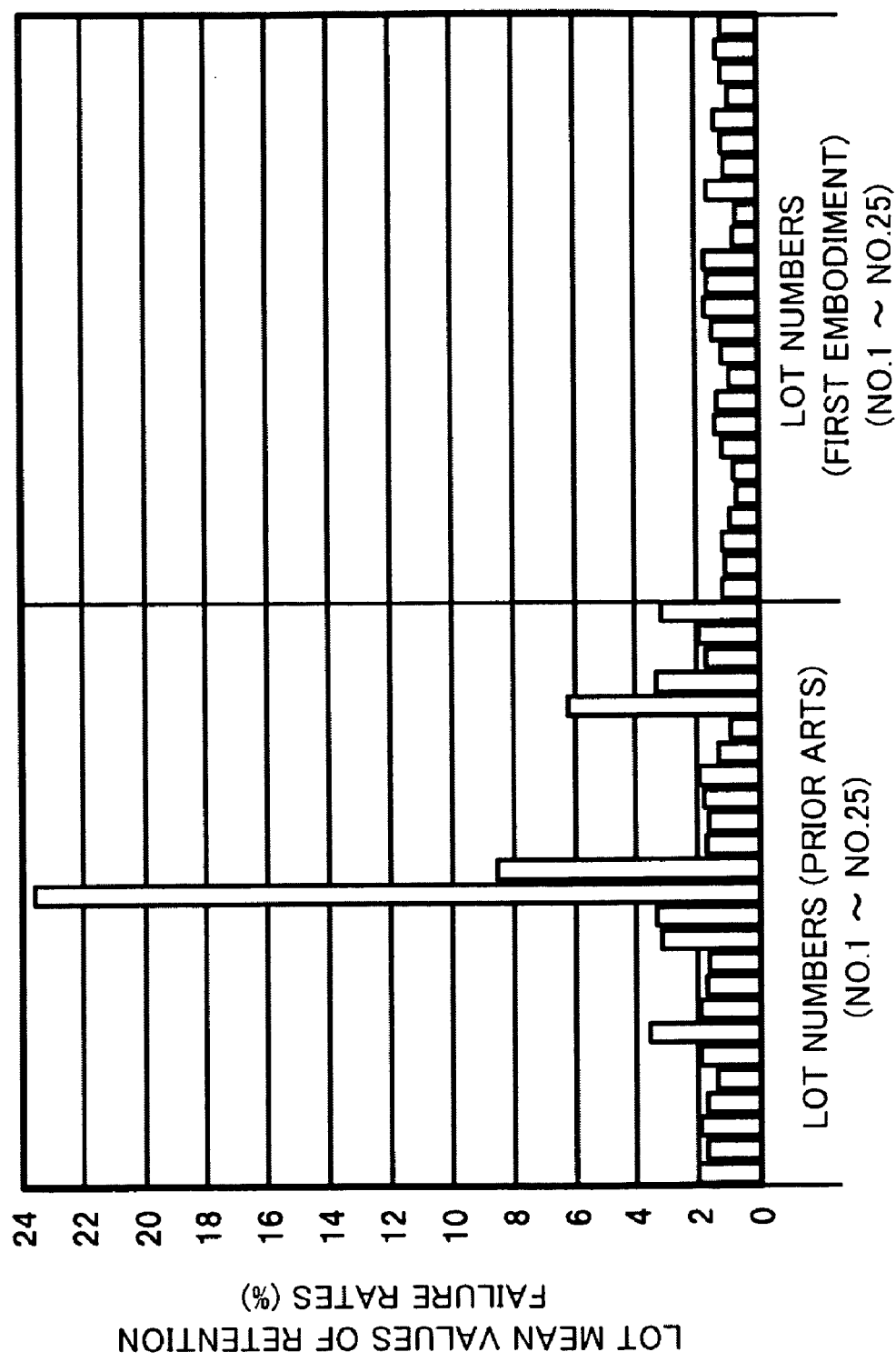
FIG. 7 illustrates failure rates in data retention of semiconductor devices of the related art and semiconductor devices of the first embodiment.

FIG. 7 illustrates lot numbers and retention failure rates of the semiconductor devices 10. In FIG. 7, the abscissa represents, in the left portion thereof, lot mean values (%) of the retention failure rates in the known art and in the right portion thereof, lot mean values (%) of the retention failure rates in the first embodiment. The ferroelectric random-access memory (FRAM) of the semiconductor device 10 of the first embodiment is a non-volatile memory, and may thus continuously store written data even after power interruptions. The ability to retain data is referred to as retention.

In FIG. 7, numbers 1 through 25 along the abscissa represent lot numbers. One scale along the abscissa represents the mean value of retention failure rates of the corresponding lot (each lot including 12 wafers). FIGS. 6A and 6B illustrates the frequencies of occurrences of orientation of PZT layers 26 of a period of 10 days throughout which 100 semiconductor wafers were annealed with 10 semiconductor wafers a day.

Referring to FIG. 7, the retention failure rate of the semiconductor devices 10 is within a range from a maximum of 23.5% to a minimum of 0.9% if the ordinary thermal annealing apparatus is used. The retention failure rate of the semiconductor devices 10 is within a range from a maximum of 1.7% to a minimum of 0.7% if the thermal annealing apparatus of the first embodiment is used. As shown in FIGS. 6A and 6B, the semiconductor devices 10 manufactured in accordance with the first embodiment is low in retention failure rate and stable in operation in comparison with the semiconductor device manufactured using the known thermal annealing apparatus.

The thermal annealing apparatus of the first embodiment vacuums the thermal annealing chamber 110 during the thermal annealing process of the ferroelectric film and then introduces the oxygen and argon gases into the thermal annealing chamber 110 at the controlled pressure. The ferroelectric film may thus be annealed in the atmosphere within the thermal annealing chamber 110 where the oxygen concentration is controlled. In accordance with the semiconductor device manufacturing method using the thermal annealing apparatus results in uniform orientation on the ferroelectric film on the semiconductor wafer.

A semiconductor device manufacturing method and a thermal annealing apparatus 2000 of a second embodiment are specifically described below. In accordance with the semiconductor device manufacturing method and the thermal annealing apparatus 2000 of the second embodiment, an oxygen gas and an argon gas are pressurized in a thermal annealing chamber prior to a thermal annealing operation. This arrangement allows oxygen to diffuse more into the ferroelectric film from the surface thereof in the thermal annealing operation. Uniform orientation is thus achieved on the ferroelectric film of the semiconductor device.

Figure 8:
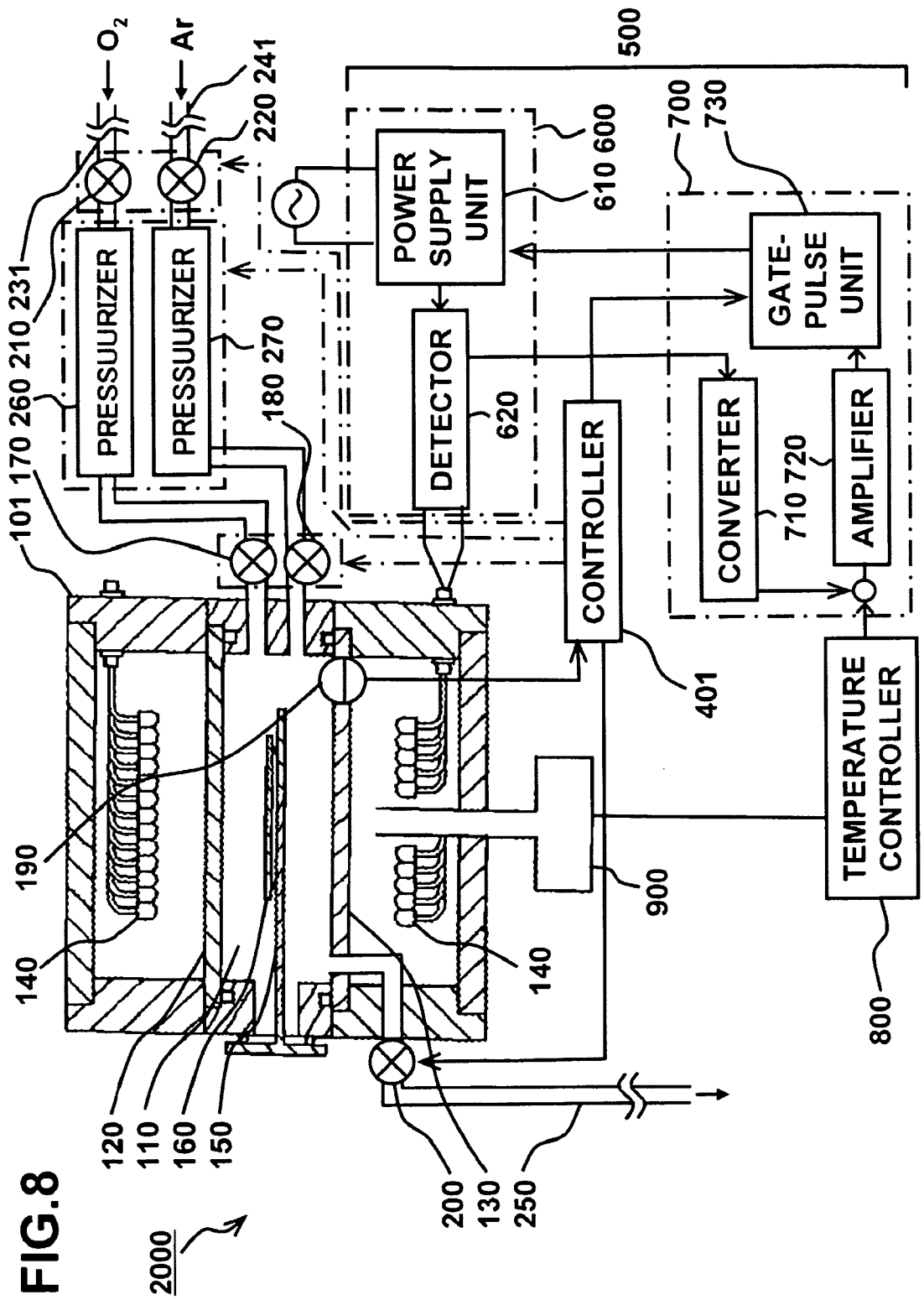
FIG. 8 illustrates a thermal annealing apparatus in accordance with a second embodiment.

FIG. 8 generally illustrates the thermal annealing apparatus 2000 of the second embodiment. The thermal annealing apparatus 2000 includes an apparatus housing 101, a controller 401, and a dose setting device 500. In the discussion of the second embodiment, elements identical to those of the first embodiment are designated with the same reference numerals and the discussion thereof is omitted.

The apparatus housing 101 includes a thermal annealing chamber 110, a quartz glass plate 120, a quartz glass plate 130, halogen lamps 140, a support arm 150, a semiconductor wafer 160, an oxygen gate valve 170, an argon gate valve 180, a pressure sensor 190, a discharge gate valve 200, an oxygen flow control valve 210, an argon flow control valve 220, an oxygen supply pipe 231, an argon supply pipe 241, a discharge pipe 250, an oxygen gas pressurizer 260, and an argon gas pressurizer 270.

The oxygen gate valve 170, the oxygen flow control valve 210 and the oxygen gas pressurizer 260 are arranged on the oxygen supply pipe 231. The argon gate valve 180, the argon flow control valve 220, and the argon gas pressurizer 270 are arranged on the argon supply pipe 241.

The discharge gate valve 200 is opened and closed to vacuum and seal the thermal annealing chamber 110, respectively. The oxygen gate valve 170 and the argon gate valve 180 are opened until the pressure within the thermal annealing chamber 110 detected by the pressure sensor 190 reaches 2 atmospheres. The oxygen gate valve 170 and the argon gate valve 180 are closed when oxygen and argon gases introduced in the thermal annealing chamber 110 reach 2 atmospheres. While the oxygen gate valve 170 and the argon gate valve 180 are opened, the oxygen flow control valve 210 and the argon flow control valve 220 are used to control the inflow rate of oxygen gas into the thermal annealing chamber 110 to about 0.055 (liter/minute) and the inflow rate of argon gas into the thermal annealing chamber 110 to about 1.95 (liters/minute). The oxygen gas pressurizer 260 is used to pressurize the oxygen gas to be introduced to about 2 atmospheres. The argon gas pressurizer 270 is used to pressurize the argon gas to be introduced to about 2 atmospheres.

In response to pressure detection information regarding the pressure within the thermal annealing chamber 110 from the pressure sensor 190, the controller 401 controls the oxygen gate valve 170, the argon gate valve 180, the discharge gate valve 200, the oxygen flow control valve 210, and the argon flow control valve 220 for opening and closing, and controls the gate-pulse unit 730 for driving.

Figure 9:
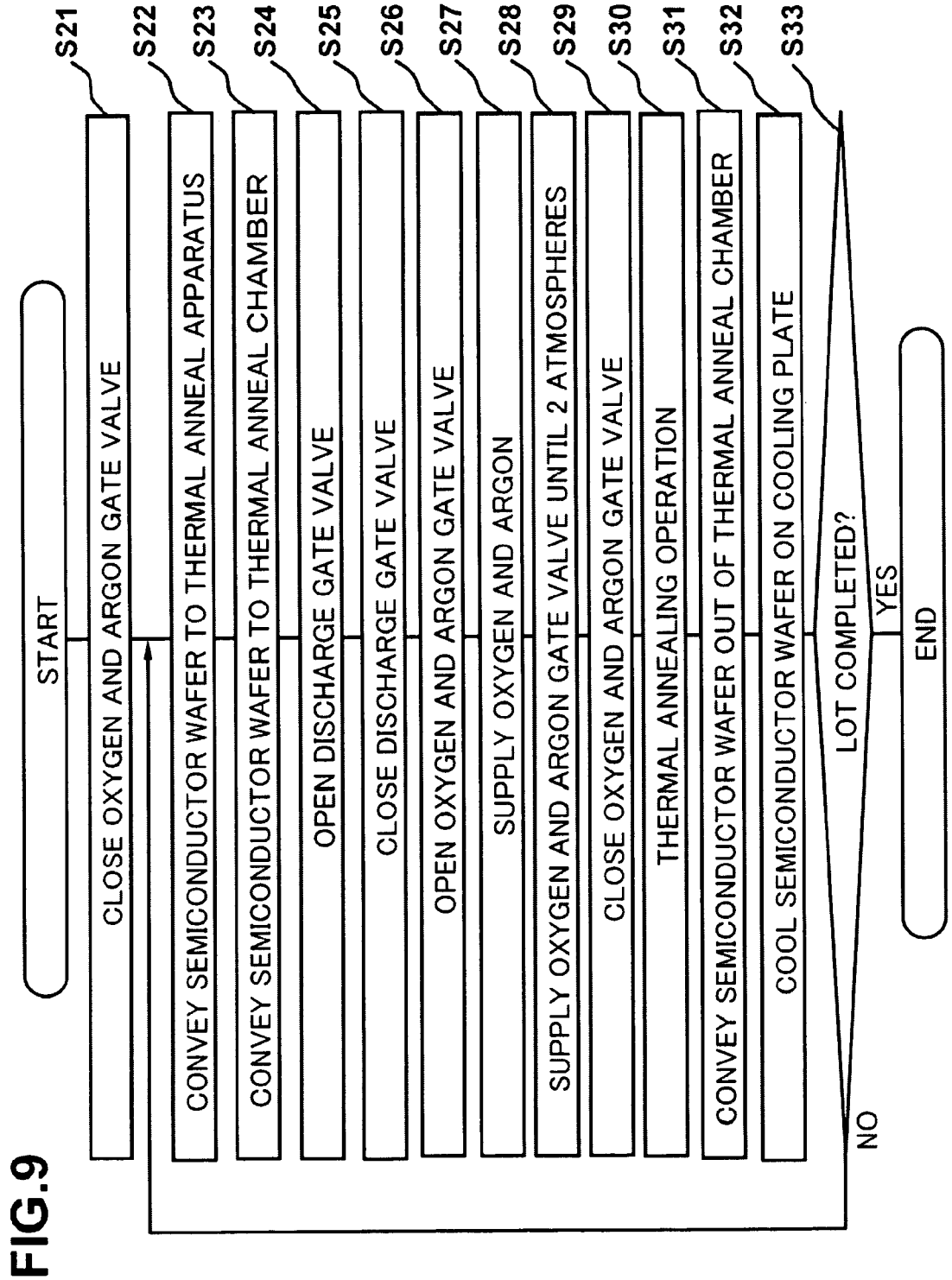
FIG. 9 is a flowchart illustrating a thermal annealing process of the semiconductor device in accordance with the second embodiment.

FIG. 9 is a flowchart illustrating the thermal annealing process of the semiconductor device 10 performed by the thermal annealing apparatus 2000 of the second embodiment. The controller 401 closes the oxygen gate valve 170 and the argon gate valve 180 (S21). The semiconductor wafer 160 is conveyed to the thermal annealing apparatus 2000 (S22). The semiconductor wafer 160 is mounted on the support arm 150 and then introduced into the thermal annealing chamber 110 (S23). The controller 401 opens the discharge gate valve 250 and then vacuums the thermal annealing chamber 110 (S24). The vacuuming operation is performed until the internal pressure of the thermal annealing chamber 110 reaches about $1.0 \times 10^{-1}$ (Pa). In the vacuuming operation, the pressure sensor 190 measures the internal pressure of the thermal annealing chamber 110. The vacuum operation is performed to evacuate gases from within the thermal annealing chamber 110. The controller 401 closes the discharge gate valve 250, thereby sealing the thermal annealing chamber 110 and maintaining a substantially vacuum state in the thermal annealing chamber 110 (S25). The controller 401 opens the oxygen gate valve 170 and the argon gate valve 180 (S26). The controller 401 opens the oxygen flow control valve 210 and the argon flow control valve 220, thereby supplying an oxygen gas and an argon gas into the thermal annealing chamber 110 via the oxygen supply pipe 231 and the argon supply pipe 241 respectively (S27). The ratio of oxygen gas to argon gas within the thermal annealing chamber 110 is preferably in a range from about 1:30 to about 1:40. The controller 401 continuously supplies the oxygen gas and argon gas into the thermal annealing chamber 110 until the internal pressure of the thermal annealing chamber 110 reaches about 2 atmospheres (S28). In the gas supply operation, the oxygen gas is pressurized by the oxygen gas pressurizer 260, and the argon gas is pressurized by the argon gas pressurizer 270. The controller 401 closes the oxygen gate valve 170, the argon gate valve 180, the oxygen flow control valve 210, and the argon flow control valve 220, thereby maintaining the volume ratio of oxygen gas to argon gas to a substantially constant value within the thermal annealing chamber 110 (S29). During a thermal annealing operation to be discussed later, the internal pressure of the thermal annealing chamber 110 rises due to dilation of the internal gases. The pressure sensor 190 only measures the internal pressure prior to the thermal annealing operation. The controller 401 performs the thermal annealing operation on the semiconductor wafer 160 based on internal pressure information related to the internal pressure in the thermal annealing chamber 110 measured by the pressure sensor 190 (S30). The thermal annealing operation is performed within a temperature range from about 550° C. to about 570° C. for about 90 seconds. Subsequent to the thermal annealing operation, the semiconductor wafer 160 is conveyed out of the thermal annealing chamber 110 by the support arm 150 (S31). The semiconductor wafer 160 is mounted on a cooling plate (not shown), and then left naturally cooled down to about 350° C. for about 5 minutes (S32). The thermal annealing process is repeated on semiconductor wafers 160 until a full manufacturing lot is completed (S33).

The semiconductor device manufacturing method and thermal annealing apparatus of the second embodiment pressurize the oxygen gas and the argon gas in the thermal annealing chamber 110 prior to the thermal annealing operation. This arrangement allows oxygen to diffuse more into the ferroelectric film from the surface thereof in the thermal annealing operation. Uniform orientation is thus achieved on the ferroelectric film of the semiconductor device.

A semiconductor device manufacturing method and a thermal annealing apparatus 3000 of a third embodiment are specifically described below. In accordance with the semiconductor device manufacturing method and thermal annealing apparatus 3000 of the third embodiment, a thermal annealing chamber has smaller in volume than the thermal annealing chamber 110 of the first and second embodiments in order to adjust more strictly the atmosphere in the thermal annealing chamber. The ferroelectric film is thus annealed in a more stabilized atmosphere. Uniform orientation is achieved on the ferroelectric film of the semiconductor device.

Figure 10:
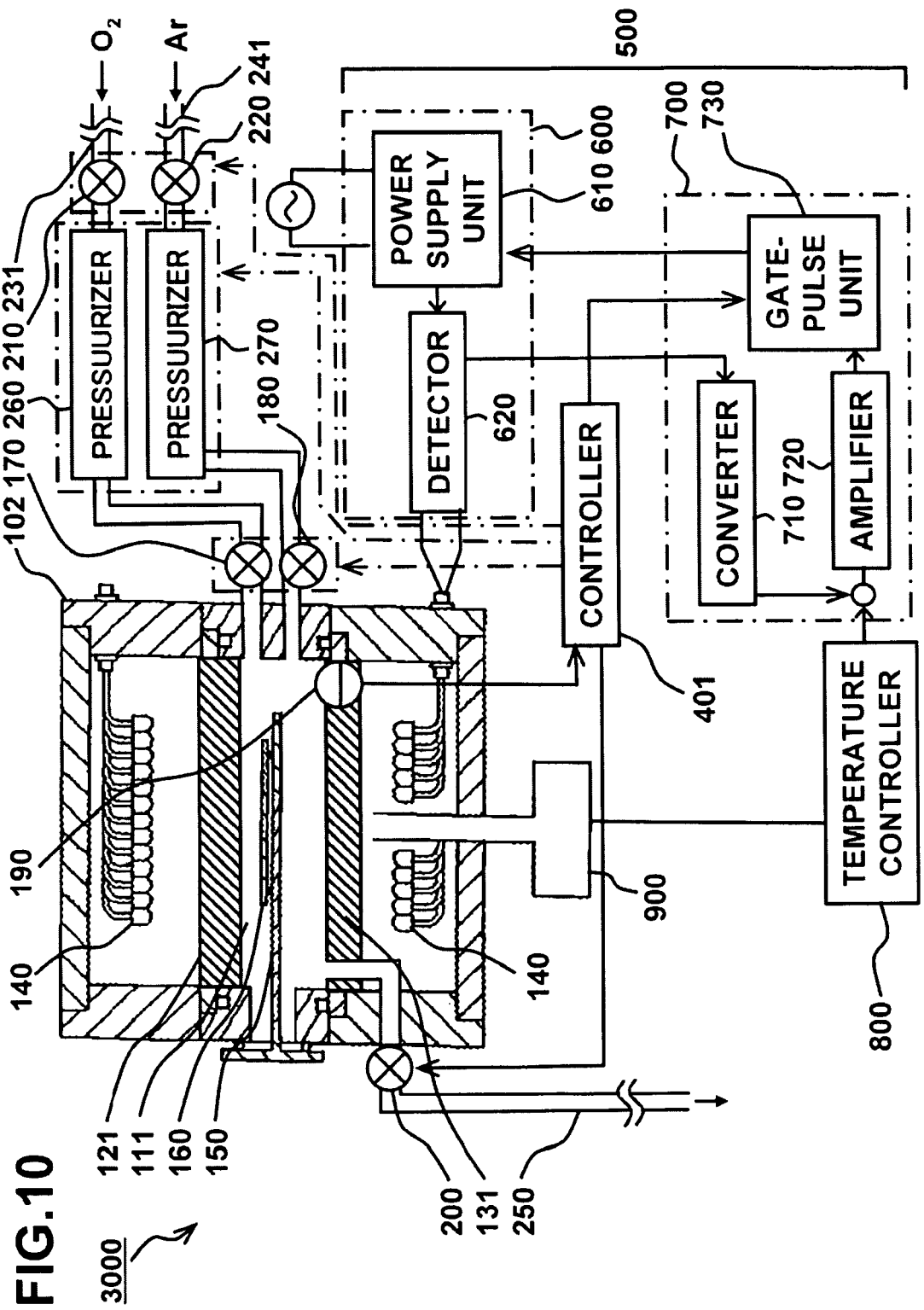
FIG. 10 illustrates a thermal annealing apparatus in accordance with a third embodiment.

FIG. 10 generally illustrates the thermal annealing apparatus 3000 of the third embodiment. The thermal annealing apparatus 3000 includes an apparatus housing 102, a controller 401, and a dose setting device 500. In the discussion of the third embodiment, elements identical to those of the second embodiment are designated with the same reference numerals and the discussion thereof is omitted.

The apparatus housing 102 includes a thermal annealing chamber 111, a tempered glass plate 121, a tempered glass plate 131, halogen lamps 140, a support arm 150, a semiconductor wafer 160, an oxygen gate valve 170, an argon gate valve 180, a pressure sensor 190, a discharge gate valve 200, an oxygen flow control valve 210, an argon flow control valve 220, an oxygen supply pipe 231, an argon supply pipe 241, a discharge pipe 250, an oxygen gas pressurizer 260, and an argon gas pressurizer 270.

As shown in FIG. 10, the apparatus housing 102 is divided into three compartments from top to bottom by the tempered glass plates 121 and 131 arranged in parallel. Top and bottom compartments are provided with a plurality of halogen lamps 140. The tempered glass plates 121 and 131 are made of quartz, and higher in strength than the quartz glass plates 120 and 130 used in the first and second embodiments. The spacing between the tempered glass plates 121 and 131 is narrower than the spacing between the quartz glass plates 120 and 130 in the first and second embodiments. The thermal annealing chamber 111 in the third embodiment is smaller in volume than the thermal annealing chamber 110 in the first and second embodiments. The glass plates 121 and 131 in the thermal annealing chamber 111 having the smaller volume are of a reinforced type so that the glass plates 121 and 131 withstand and are not destroyed by the internal pressure of the oxygen gas and argon gases.

Figure 11:
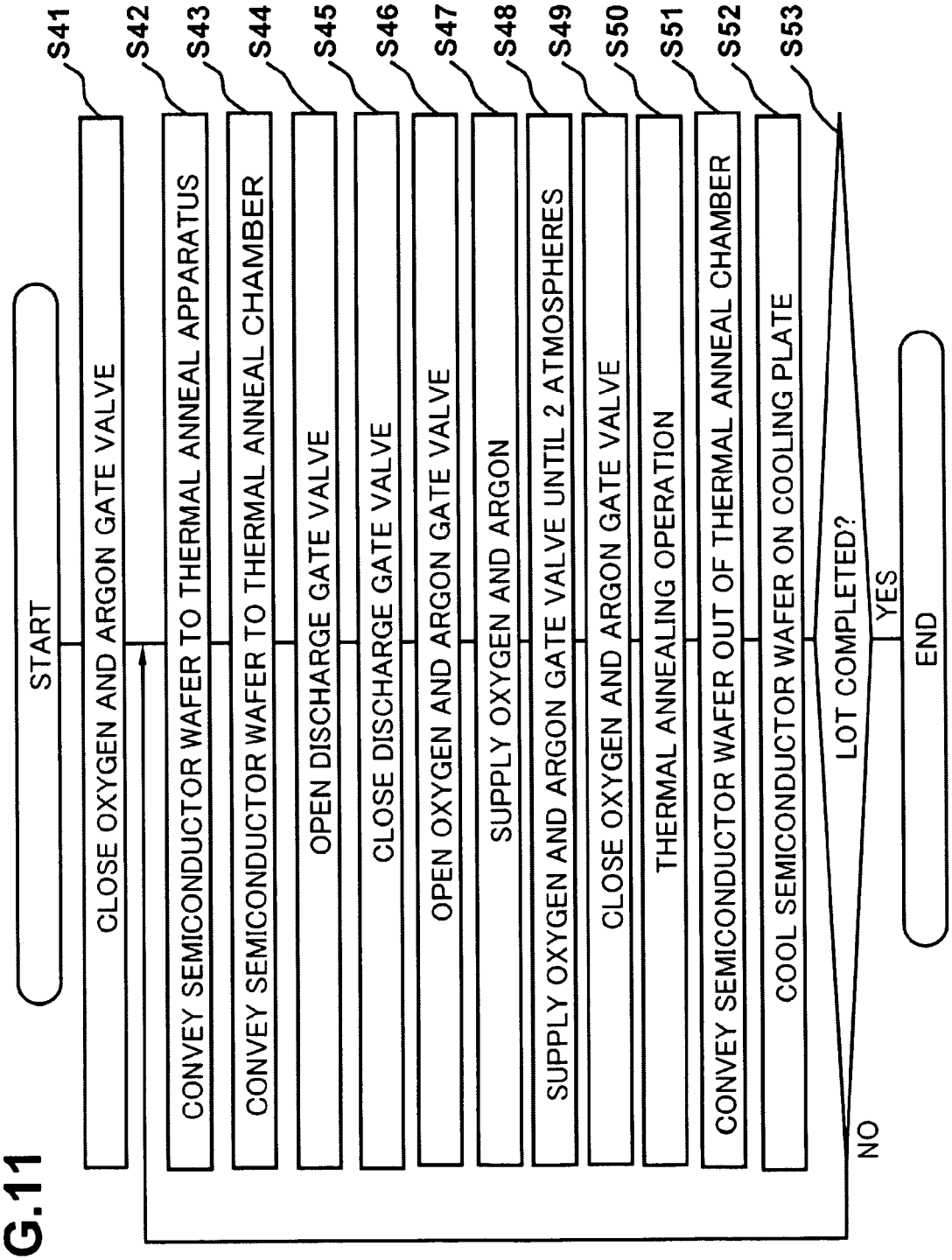
FIG. 11 is a flowchart illustrating a thermal annealing process of a semiconductor device in accordance with the third embodiment.

FIG. 11 is a flowchart illustrating the annealing process of the semiconductor device 10 in the thermal annealing apparatus 3000 of the third embodiment. The controller 401 closes the oxygen gate valve 170 and the argon gate valve 180 (S41). The semiconductor wafer 160 is conveyed to the thermal annealing apparatus 3000 (S42). The semiconductor wafer 160 is mounted on the support arm 150 and then introduced into the thermal annealing chamber 111 (S43). The controller 401 opens the discharge gate valve 200 and then vacuums the thermal annealing chamber 111 (S44). The vacuuming operation is performed until the internal pressure of the thermal annealing chamber 111 reaches about $1.0\times10^{-1}$ (Pa). In the vacuuming operation, the pressure sensor 190 measures the internal pressure of the thermal annealing chamber 111. The vacuum operation is performed to evacuate gases from within the thermal annealing chamber 111. The controller 401 closes the discharge gate valve 200, thereby sealing the thermal annealing chamber 111 and maintaining a substantially vacuum state in the thermal annealing chamber 111 (S45). The controller 401 opens the oxygen gate valve 170 and the argon gate valve 180 (S46). The controller 401 opens the oxygen flow control valve 210 and the argon flow control valve 220, thereby supplying an oxygen gas and an argon gas into the thermal annealing chamber 111 via the oxygen supply pipe 231 and the argon supply pipe 241 respectively (S47). In the gas supply operation, the inflow rate of the oxygen gas is preferably about 0.055 (liter/minute), and the inflow rate of the argon gas is preferably about 1.95 (liters/minute). The ratio of oxygen gas to argon gas within the thermal annealing chamber 111 is preferably in a range from about 1:30 to about 1:40. The controller 401 continuously supplies the oxygen gas and argon gas into the thermal annealing chamber 111 until the internal pressure of the thermal annealing chamber 111 reaches about 2 atmospheres (S48). In the gas supply operation, the oxygen gas is pressurized by the oxygen gas pressurizer 260, and the argon gas is pressurized by the argon gas pressurizer 270. The controller 401 closes the oxygen gate valve 170, the argon gate valve 180, the oxygen flow control valve 210, and the argon flow control valve 220, thereby maintaining the volume ratio of oxygen gas to argon gas to a substantially constant value within the thermal annealing chamber 111 (S49). The controller 401 performs the thermal annealing operation on the semiconductor wafer 160 based on internal pressure information related to the internal pressure in the thermal annealing chamber 111 measured by the pressure sensor 190 (S50). The thermal annealing operation is performed within a temperature range from about 550° C. to about 570° C. for about 90 seconds. Subsequent to the thermal annealing operation, the semiconductor wafer 160 is conveyed out of the thermal annealing chamber 111 by the support arm 150 (S51). The semiconductor wafer 160 is mounted on a cooling plate (not shown), and then left naturally cooled down to about 350° C. for about 5 minutes (S52). The thermal annealing process is repeated on semiconductor wafers 160 until a full manufacturing lot is completed (S53).

The thermal annealing apparatus 3000 of the third embodiment includes the thermal annealing chamber smaller in size than the counterpart in the first and second embodiments in order to adjust precisely the internal pressure. The ferroelectric film may thus be annealed in a more stable condition. Uniform orientation is achieved on the ferroelectric film of the semiconductor device.

A semiconductor device manufacturing method and a thermal annealing apparatus 4000 of a fourth embodiment are specifically described below with reference to the accompanying drawings. In accordance with the semiconductor device manufacturing method and the thermal annealing apparatus 4000 of the fourth embodiment, a tempered glass plate is spaced during a cooling operation subsequent to a thermal annealing operation in order to control variations in characteristics of the ferroelectric film caused by heat radiated from the tempered glass plate. A temperature profile subsequent to the thermal annealing operation is thus precisely controlled.

Figure 12:
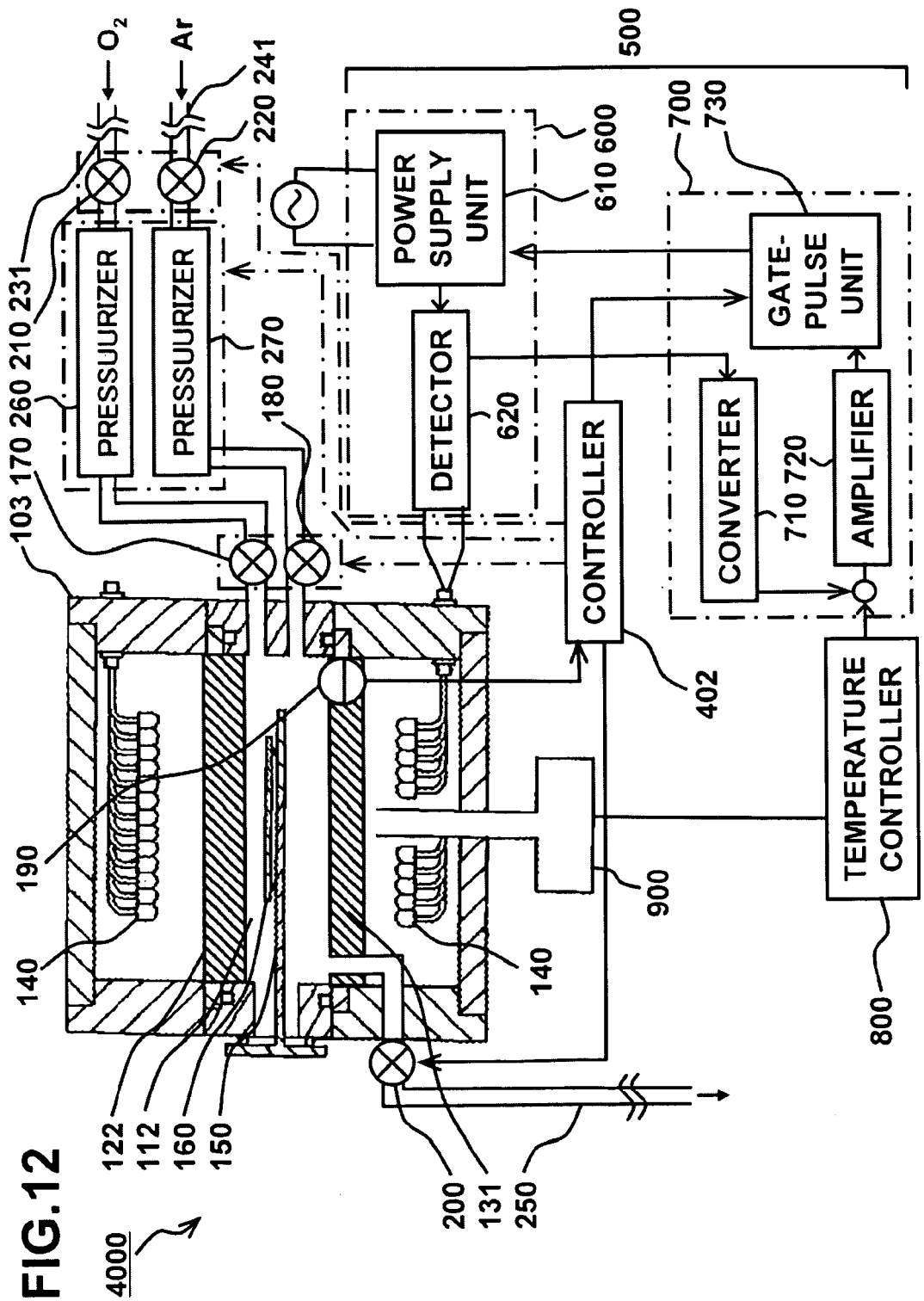
FIG. 12 illustrates a thermal annealing apparatus in accordance with a fourth embodiment.

FIG. 12 generally illustrates the thermal annealing apparatus 4000 of the fourth embodiment. The thermal annealing apparatus 4000 includes an apparatus housing 103, a controller 402, and a dose setting device 500. In the discussion of the fourth embodiment, elements identical to those of the third embodiment are designated with the same reference numerals and the discussion thereof is omitted.

The apparatus housing 103 includes a thermal annealing chamber 112, a movable tempered glass plate 122, a tempered glass plate 131, halogen lamps 140, a support arm 150, a semiconductor wafer 160, an oxygen gate valve 170, an argon gate valve 180, a pressure sensor 190, a discharge gate valve 200, an oxygen flow control valve 210, an argon flow control valve 220, an oxygen supply pipe 231, an argon supply pipe 241, a discharge pipe 250, an oxygen gas pressurizer 260, and an argon gas pressurizer 270.

As shown in FIG. 12, the apparatus housing 103 is divided into three compartments from top to bottom by the movable tempered glass plate 122 and the tempered glass plate 131 arranged in parallel. Top and bottom compartments are provided with a plurality of halogen lamps 140. The movable tempered glass plate 122 and tempered glass plate 131 are made of high-strength quartz as the counterparts in the third embodiment. The intermediate compartment is the thermal annealing chamber 112. The semiconductor wafer 160 as a sample to be heated is conveyed on the support arm 150 into the thermal annealing chamber 112. The movable tempered glass plate 122 is moved upward and downward within the thermal annealing chamber 112. More specifically, the movable tempered glass plate 122 is moved to be spaced from the semiconductor wafer 160 subsequent to the end of the thermal annealing operation to the semiconductor wafer 160. This operation controls the characteristic variations of the ferroelectric capacitor by reducing the effect of heat radiated from the movable tempered glass plate 122 on the semiconductor wafer 160 subsequent to the thermal annealing operation on the semiconductor wafer 160 to be discussed later.

In accordance with pressure information relating to the internal pressure of the thermal annealing chamber 112 from the pressure sensor 190, the controller 402 controls the oxygen gate valve 170, the argon gate valve 180, the discharge gate valve 200, the oxygen flow control valve 210, and the argon flow control valve 220 for opening and closing, and controls the gate-pulse unit 730 for driving. Furthermore, the controller 402 controls the oxygen gas pressurizer 260 and the argon gas pressurizer 270. Using a driver (not shown), the controller 402 moves upward or downward the movable tempered glass plate 122.

Figure 13:
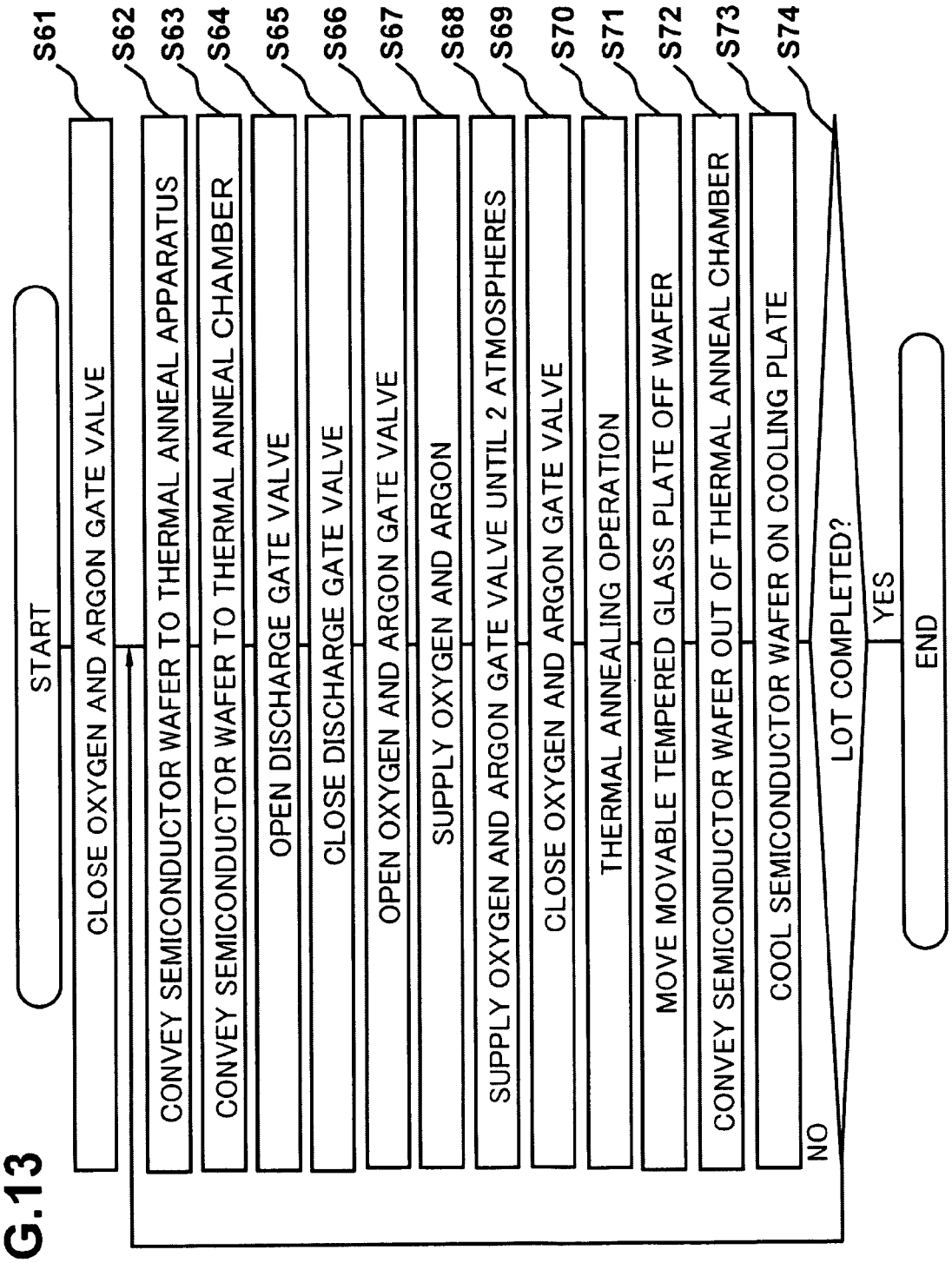
FIG. 13 is a flowchart illustrating a thermal annealing process of a semiconductor device of the fourth embodiment.

FIG. 13 is a flowchart illustrating the annealing process of the semiconductor device 10 in the thermal annealing apparatus 4000 of the fourth embodiment. The controller 402 closes the oxygen gate valve 170 and the argon gate valve 180 (S61). The semiconductor wafer 160 is conveyed to the thermal annealing apparatus 4000 (S62). The semiconductor wafer 160 is mounted on the support arm 150 and then introduced into the thermal annealing chamber 112 (S63). The controller 402 opens the discharge gate valve 200 and then vacuums the thermal annealing chamber 112 (S64). The vacuuming operation is performed until the internal pressure of the thermal annealing chamber 112 reaches about $1.0 \times 10^{-1}$ (Pa). In the vacuuming operation, the pressure sensor 190 measures the internal pressure of the thermal annealing chamber 112. The vacuum operation is performed to evacuate gases from within the thermal annealing chamber 112. The controller 402 closes the discharge gate valve 200, thereby sealing the thermal annealing chamber 112 and maintaining a substantially vacuum state in the thermal annealing chamber 112 (S65). The controller 402 opens the oxygen gate valve 170 and the argon gate valve 180 (S66). The controller 402 opens the oxygen flow control valve 210 and the argon flow control valve 220, thereby supplying an oxygen gas and an argon gas into the thermal annealing chamber 112 via the oxygen supply pipe 231 and the argon supply pipe 241 respectively (S67). In the gas supply operation, the inflow rate of the oxygen gas is preferably about 0.055 (liter/minute), and the inflow rate of the argon gas is preferably about 1.95 (liters/minute). The ratio of oxygen gas to argon gas within the thermal annealing chamber 112 is preferably in a range from about 1:30 to about 1:40. The controller 402 continuously supplies the oxygen gas and argon gas into the thermal annealing chamber 112 until the internal pressure of the thermal annealing chamber 112 reaches about 2 atmospheres (S68). During a thermal annealing operation to be discussed later, the internal pressure of the thermal annealing chamber 110 rises due to dilation of the internal gases. The pressure sensor 190 only measures the internal pressure prior to the thermal annealing operation. In the gas supply operation, the oxygen gas is pressurized by the oxygen gas pressurizer 260, and the argon gas is pressurized by the argon gas pressurizer 270. The controller 402 closes the oxygen gate valve 170, the argon gate valve 180, the oxygen flow control valve 210, and the argon flow control valve 220, thereby maintaining the volume ratio of oxygen gas to argon gas to a substantially constant value within the thermal annealing chamber 112 (S69). The controller 402 performs the thermal annealing operation on the semiconductor wafer 160 based on internal pressure information related to the internal pressure in the thermal annealing chamber 112 measured by the pressure sensor 190 (S70). The thermal annealing operation is performed within a temperature range from about 550° C. to about 570° C. for about 90 seconds. Subsequent to the thermal annealing operation, the movable tempered glass plate 122 is moved to be spaced from the semiconductor wafer 160 (S71). The semiconductor wafer 160 is conveyed out of the thermal annealing chamber 112 by the support arm 150 (S72). The semiconductor wafer 160 is mounted on a cooling plate (not shown), and then left naturally cooled down to about 350° C. for about 5 minutes (S73). The thermal annealing process is repeated on semiconductor wafers 160 until a full manufacturing lot is completed (S74).

In accordance with the semiconductor device manufacturing method and the thermal annealing apparatus 4000 of the fourth embodiment, the tempered glass plate 122 is spaced from the semiconductor wafer 160 during the cooling operation subsequent to the thermal annealing operation in order to control characteristics variations of the ferroelectric film caused by heat radiated from the tempered glass plate 122. The temperature profile subsequent to the thermal annealing operation is thus precisely controlled.

A semiconductor device manufacturing method and a thermal annealing apparatus 5000 of a fifth embodiment are specifically described below with reference to the accompanying drawings. In accordance with the semiconductor device manufacturing method and thermal annealing apparatus 5000 of the fifth embodiment, a pressure within a thermal annealing chamber is increased by placing a movable tempered glass plate closer to a semiconductor wafer during a thermal annealing operation. Oxygen may thus be diffused into a ferroelectric film during the thermal annealing operation.

Figure 14:
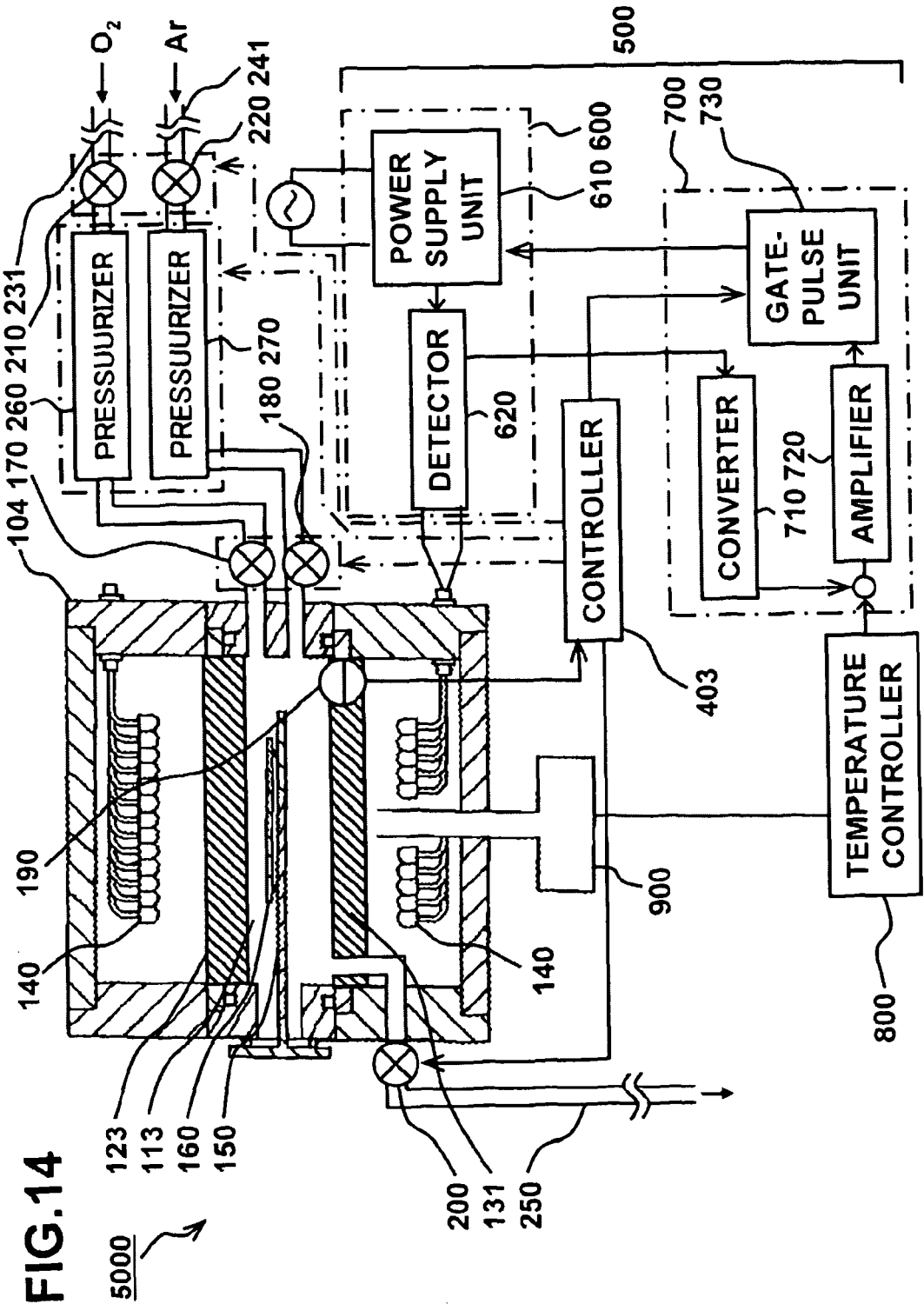
FIG. 14 illustrates a thermal annealing apparatus in accordance with a fifth embodiment.

FIG. 14 generally illustrates the thermal annealing apparatus 5000 of the fifth embodiment. As shown in FIG. 14, the thermal annealing apparatus 5000 includes an apparatus housing 104, a controller 403, and a dose setting device 500. In the discussion of the fifth embodiment, elements identical to those of the fourth embodiment are designated with the same reference numerals and the discussion thereof is omitted.

The apparatus housing 104 includes a thermal annealing chamber 113, a movable tempered glass plate 123, a tempered glass plate 131, halogen lamps 140, a support arm 150, a semiconductor wafer 160, an oxygen gate valve 170, an argon gate valve 180, a pressure sensor 190, a discharge gate valve 200, an oxygen flow control valve 210, an argon flow control valve 220, an oxygen supply pipe 231, an argon supply pipe 241, a discharge pipe 250, an oxygen gas pressurizer 260, and an argon gas pressurizer 270.

The movable tempered glass plate 123 is designed to move upward and downward within the thermal annealing chamber 113. In comparison with the movable tempered glass plate 122 of the fourth embodiment, the movable tempered glass plate 123 of the fifth embodiment may move close to within a spacing of about 20 mm of the semiconductor wafer 160. By placing the movable tempered glass plate 123 closer to the semiconductor wafer 160 during the thermal annealing operation, the internal pressure may be raised within the thermal annealing chamber 113. Oxygen may be diffused into the ferroelectric film during the thermal annealing operation.

In accordance with pressure information relating to the internal pressure of the thermal annealing chamber 113 from the pressure sensor 190, the controller 403 controls the oxygen gate valve 170, the argon gate valve 180, the discharge gate valve 200, the oxygen flow control valve 210, and the argon flow control valve 220 for opening and closing, and controls the gate-pulse unit 730 for driving. Furthermore, the controller 403 controls the oxygen gas pressurizer 260 and the argon gas pressurizer 270. Using a driver (not shown), the controller 403 moves upward or downward the movable tempered glass plate 123.

Figure 15:
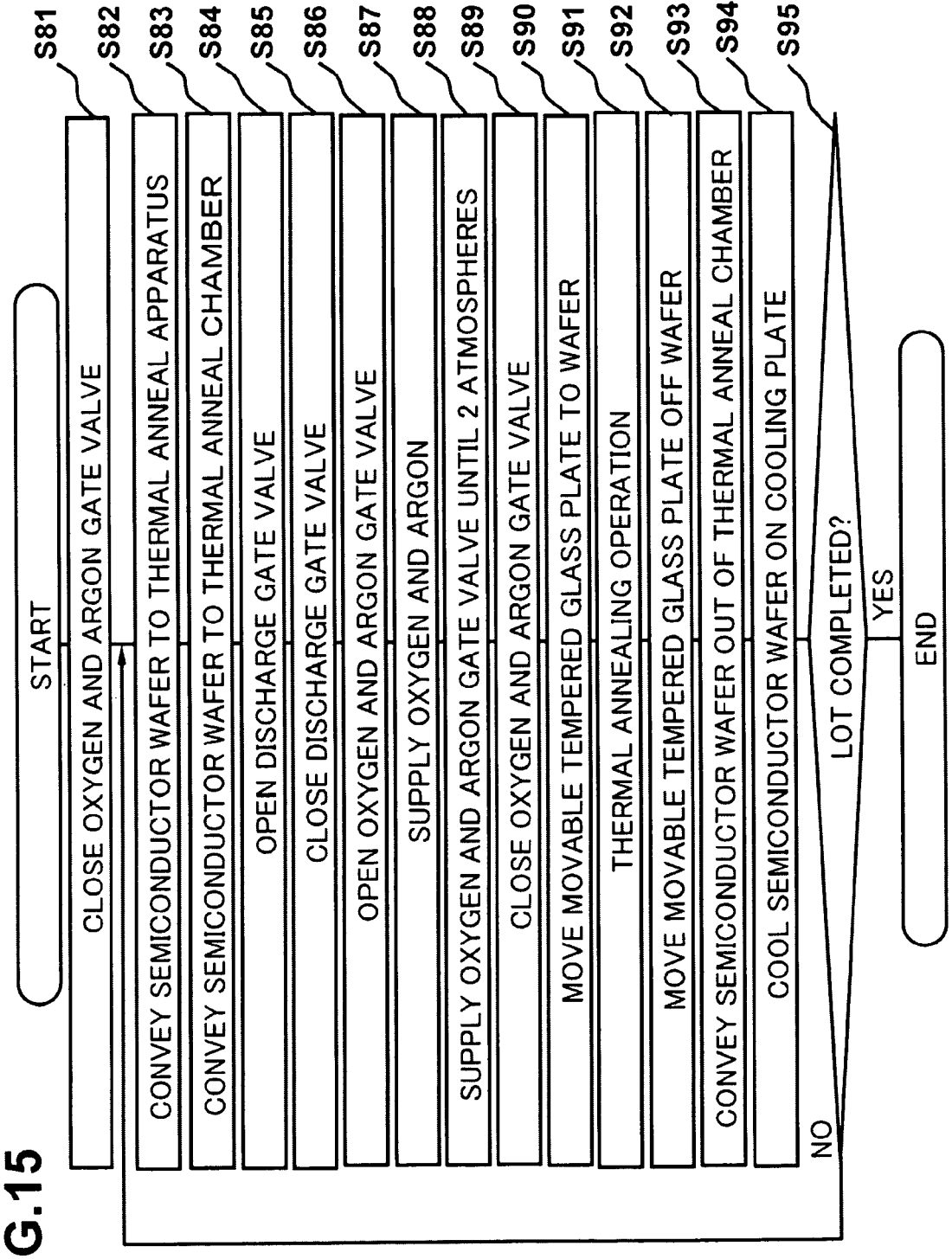
FIG. 15 is a flowchart illustrating a thermal annealing process of a semiconductor device of the fifth embodiment.

FIG. 15 is a flowchart illustrating the annealing process of the semiconductor device 10 in the thermal annealing apparatus 5000 of the fifth embodiment. The controller 403 closes the oxygen gate valve 170 and the argon gate valve 180 (S81). The semiconductor wafer 160 is conveyed to the thermal annealing apparatus 5000 (S82). The semiconductor wafer 160 is mounted on the support arm 150 and then introduced into the thermal annealing chamber 113 (S83). The controller 403 opens the discharge gate valve 200 and then vacuums the thermal annealing chamber 113 (S84). The vacuuming operation is performed until the internal pressure of the thermal annealing chamber 113 reaches about $1.0 \times 10^{-1}$ (Pa). In the vacuuming operation, the pressure sensor 190 measures the internal pressure of the thermal annealing chamber 113. The vacuum operation is performed to evacuate gases from within the thermal annealing chamber 113. The controller 403 closes the discharge gate valve 200, thereby sealing the thermal annealing chamber 113 and maintaining a substantially vacuum state in the thermal annealing chamber 113 (S85). The controller 403 opens the oxygen gate valve 170 and the argon gate valve 180 (S86). The controller 403 opens the oxygen flow control valve 210 and the argon flow control valve 220, thereby supplying an oxygen gas and an argon gas into the thermal annealing chamber 113 via the oxygen supply pipe 231 and the argon supply pipe 241 respectively (S87). In the gas supply operation, the inflow rate of the oxygen gas is preferably about 0.055 (liter/minute), and the inflow rate of the argon gas is preferably about 1.95 (liters/minute). The ratio of oxygen gas to argon gas within the thermal annealing chamber 113 is preferably in a range from about 1:30 to about 1:40. The controller 403 continuously supplies the oxygen gas and argon gas into the thermal annealing chamber 113 until the internal pressure of the thermal annealing chamber 113 reaches about 2 atmospheres (S88). In the gas supply operation, the oxygen gas is pressurized by the oxygen gas pressurizer 260, and the argon gas is pressurized by the argon gas pressurizer 270. The controller 403 closes the oxygen gate valve 170, the argon gate valve 180, the oxygen flow control valve 210, and the argon flow control valve 220, thereby maintaining the volume ratio of oxygen gas to argon gas to a substantially constant value within the thermal annealing chamber 113 (S89). The movable tempered glass plate 123 is placed closer to the semiconductor wafer 160 (S90). This step decreases the volume of the thermal annealing chamber 113, thereby causing the internal pressure of the thermal annealing chamber 113 to increase. As a result, the inner gas pressures of the oxygen gas and argon gas applied to the semiconductor wafer 160 increase. The controller 403 performs the thermal annealing operation on the semiconductor wafer 160 based on internal pressure information related to the internal pressure in the thermal annealing chamber 113 measured by the pressure sensor 190 (S91). The thermal annealing operation is performed within a temperature range from about 550° C. to about 570° C. for about 90 seconds. Subsequent to the thermal annealing operation, the movable tempered glass plate 123 is moved to be spaced from the semiconductor wafer 160 (S92). The semiconductor wafer 160 is conveyed out of the thermal annealing chamber 113 by the support arm 150 (S93). The semiconductor wafer 160 is mounted on a cooling plate (not shown), and then left naturally cooled down to about 350° C. for about 5 minutes (S94). The thermal annealing process is repeated on semiconductor wafers 160 until a full manufacturing lot is completed (S95).

In accordance with the semiconductor device manufacturing method and the thermal annealing apparatus 5000 of the fifth embodiment, the tempered glass plate 123 is placed closer to the semiconductor wafer 160 during the thermal annealing operation to increase the internal pressure of the thermal annealing chamber 113. Oxygen is thus diffused into the ferroelectric film during the thermal annealing operation. Uniform orientation is achieved on the ferroelectric film of the semiconductor device.

A semiconductor device manufacturing method and a thermal annealing apparatus 6000 of a sixth embodiment are specifically described below with reference to the accompanying drawings. In accordance with the semiconductor device manufacturing method and the thermal annealing apparatus 6000 of the sixth embodiment, a fan causes an oxygen gas and an argon gas to circulate within a thermal annealing chamber so that a concentration distribution of the oxygen gas and a concentration distribution of the argon gas are substantially uniform within the thermal annealing chamber. The thermal annealing operation is performed on the ferroelectric film of the semiconductor device in a stable atmosphere.

Figure 16:
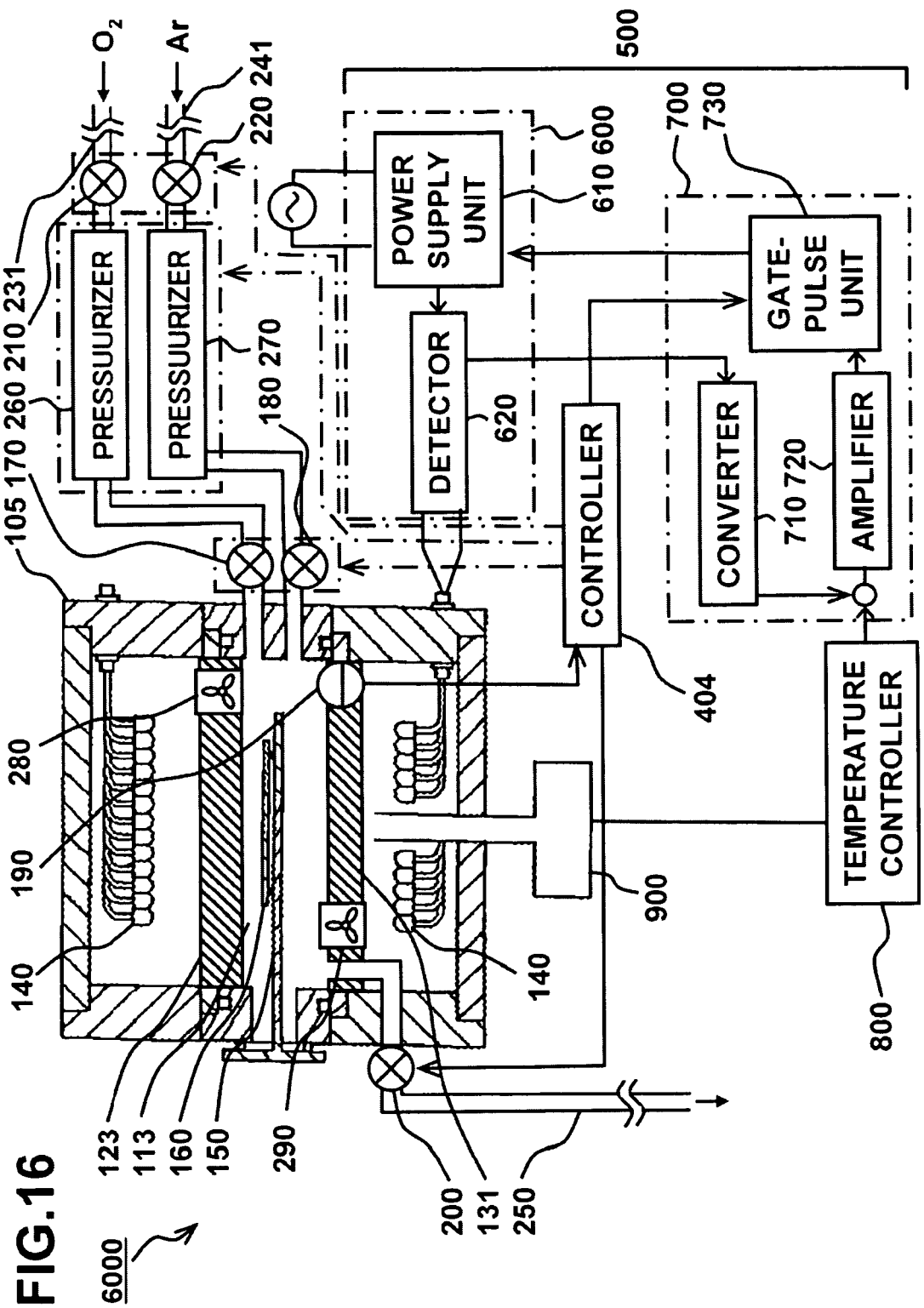
FIG. 16 illustrates a thermal annealing apparatus in accordance with a sixth embodiment.

FIG. 16 generally illustrates a thermal annealing apparatus 6000 of the sixth embodiment. As shown in FIG. 16, the thermal annealing apparatus 6000 includes an apparatus housing 105, a controller 404, and a dose setting device 500. In the discussion of the sixth embodiment, elements identical to those of the fifth embodiment are designated with the same reference numerals and the discussion thereof is omitted.

The apparatus housing 105 includes a thermal annealing chamber 114, a movable tempered glass plate 123, a quartz glass plate 131, halogen lamps 140, a support arm 150, a semiconductor wafer 160, an oxygen gate valve 170, an argon gate valve 180, a pressure sensor 190, a discharge gate valve 200, an oxygen flow control valve 210, an argon flow control valve 220, an oxygen supply pipe 231, an argon supply pipe 241, a discharge pipe 250, an oxygen gas pressurizer 260, an argon gas pressurizer 270, and fans 280 and 290.

The fans 280 and 290 are arranged to face the thermal annealing chamber 114 and driven by a motor (not shown) arranged external to the thermal annealing chamber 114. The fans 280 and 290 circulate the atmosphere within the thermal annealing chamber 114 prior to and during the thermal annealing operation so that the distributions of the oxygen gas and argon gas remain uniform within the thermal annealing chamber 114.

In accordance with pressure information relating to the internal pressure of the thermal annealing chamber 114 from the pressure sensor 190, the controller 404 controls the oxygen gate valve 170, the argon gate valve 180, the discharge gate valve 200, the oxygen flow control valve 210, and the argon flow control valve 220 for opening and closing, and controls the gate-pulse unit 730 for driving. Furthermore, the controller 404 controls the oxygen gas pressurizer 260 and the argon gas pressurizer 270. The controller 404 moves the movable tempered glass plate 122 upward and downward using a driver (not shown). In response to the pressure information relating to the internal pressure of the thermal annealing chamber 114 from the pressure sensor 190, the controller 404 causes the fans 280 and 290 to rotate using a motor (not shown).

Figure 17:
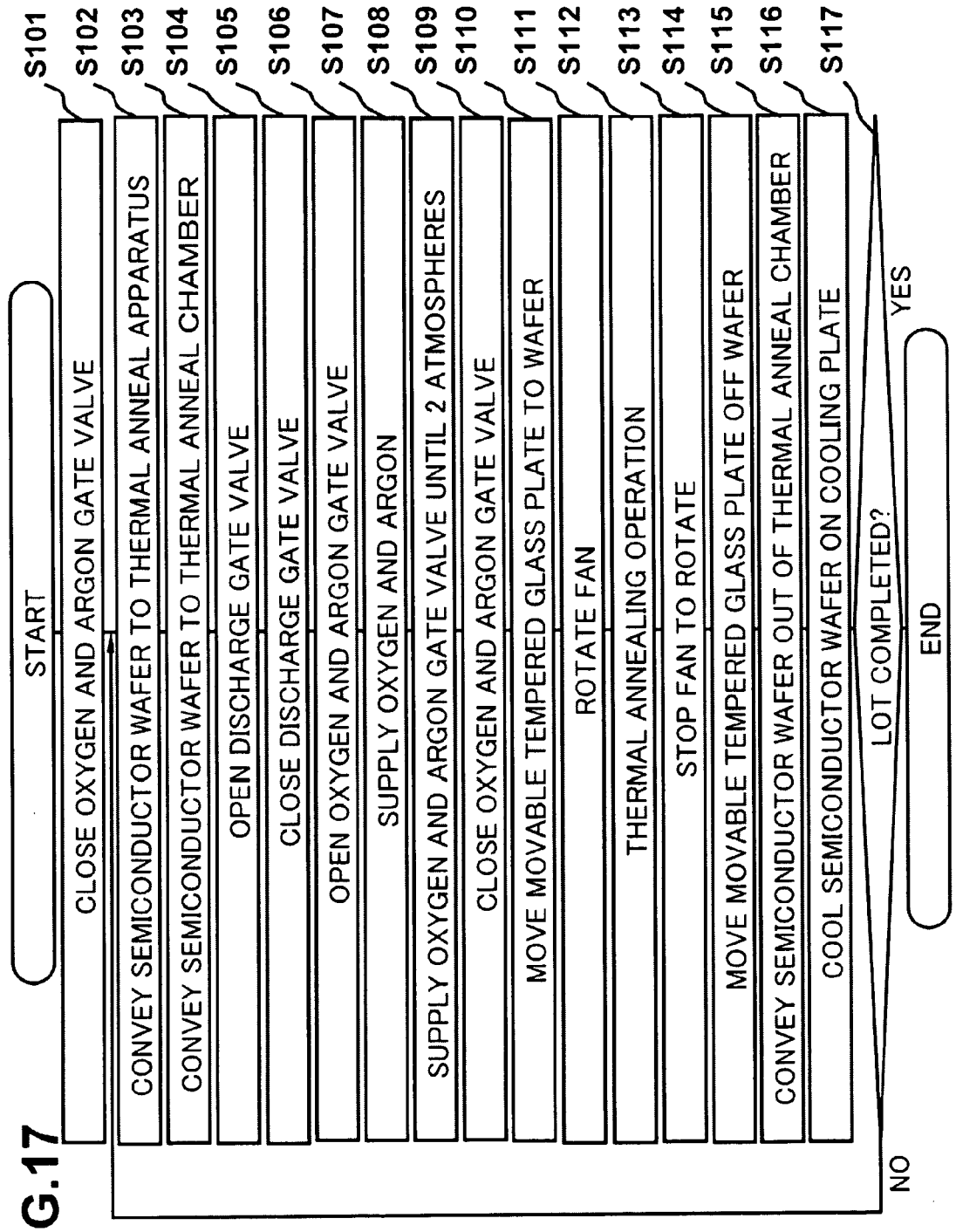
FIG. 17 is a flowchart illustrating a thermal annealing process of a semiconductor device of the sixth embodiment.

FIG. 17 is a flowchart illustrating the annealing process of the semiconductor device 10 in the thermal annealing apparatus 6000 of the sixth embodiment. The controller 404 closes the oxygen gate valve 170 and the argon gate valve 180 (S101). The semiconductor wafer 160 is conveyed to the thermal annealing apparatus 6000 (S102). The semiconductor wafer 160 is mounted on the support arm 150 and then introduced into the thermal annealing chamber 114 (S103). The controller 404 opens the discharge gate valve 200 and then vacuums the thermal annealing chamber 114 (S104). The vacuuming operation is performed until the internal pressure of the thermal annealing chamber 114 reaches about $1.0 \times 10^{-1}$ (Pa). In the vacuuming operation, the pressure sensor 190 measures the internal pressure of the thermal annealing chamber 114. The vacuum operation is performed to evacuate gases from within the thermal annealing chamber 114. The controller 404 closes the discharge gate valve 200, thereby sealing the thermal annealing chamber 114 and maintaining a substantially vacuum state in the thermal annealing chamber 114 (S105). The controller 404 opens the oxygen gate valve 170 and the argon gate valve 180 (S106). The controller 404 opens the oxygen flow control valve 210 and the argon flow control valve 220, thereby supplying an oxygen gas and an argon gas into the thermal annealing chamber 114 via the oxygen supply pipe 231 and the argon supply pipe 241 respectively (S107). In the gas supply operation, the inflow rate of the oxygen gas is preferably about 0.055 (liter/minute), and the inflow rate of the argon gas is preferably about 1.95 (liters/minute). The ratio of oxygen gas to argon gas within the thermal annealing chamber 114 is preferably in a range from about 1:30 to about 1:40. The controller 404 continuously supplies the oxygen gas and argon gas into the thermal annealing chamber 114 until the internal pressure of the thermal annealing chamber 114 reaches about 2 atmospheres (S108). In the gas supply operation, the oxygen gas is pressurized by the oxygen gas pressurizer 260, and the argon gas is pressurized by the argon gas pressurizer 270. The controller 404 closes the oxygen gate valve 170, the argon gate valve 180, the oxygen flow control valve 210, and the argon flow control valve 220, thereby maintaining the volume ratio of oxygen gas to argon gas to a substantially constant value within the thermal annealing chamber 114 (S109). The movable tempered glass plate 123 is placed closer to the semiconductor wafer 160 (S110). The controller 404 causes the fans 280 and 290 to rotate, thereby circulating the oxygen and argon gases within a thermal annealing chamber so that the concentration distribution of the oxygen gas and the concentration distribution of the argon gas are substantially uniform within the thermal annealing chamber 114. The controller 404 performs the thermal annealing operation on the semiconductor wafer 160 based on internal pressure information related to the internal pressure in the thermal annealing chamber 114 measured by the pressure sensor 190 (S111). The thermal annealing operation is performed within a temperature range from about 550° C. to about 570° C. for about 90 seconds. Subsequent to the thermal annealing operation, the controller 404 causes the fans 280 and 290 to stop rotating (S112). The movable quartz glass plate 123 is then moved to be spaced from the semiconductor wafer 160 (S113). The semiconductor wafer 160 is conveyed out of the thermal annealing chamber 114 by the support arm 150 (S114). The semiconductor wafer 160 is mounted on a cooling plate (not shown), and then left naturally cooled down to about 350° C. for about 5 minutes (S115). The thermal annealing process is repeated on semiconductor wafers 160 until a full manufacturing lot is completed (S116).

In accordance with the semiconductor device manufacturing method and the thermal annealing apparatus 600 of the sixth embodiment, the fans 280 and 290 cause the oxygen gas and argon gases to circulate within the thermal annealing chamber 114 so that the concentration distribution of the oxygen gas and the concentration distribution of the argon gas are substantially uniform within the thermal annealing chamber 114. The thermal annealing operation is performed on the ferroelectric film of the semiconductor device in a stable atmosphere.

What is claimed is:

1. A method of manufacturing a semiconductor device, comprising:
  forming a ferroelectric film over a substrate;
  placing the substrate having the ferroelectric film in a chamber substantially held in vacuum;
  introducing oxygen and an inert gas into the chamber;
  sealing the chamber after introducing oxygen and the inert gas into the chamber; and
  annealing the ferroelectric film in the chamber containing oxygen and the inert gas while the chamber is maintained sealed.

2. The method of manufacturing the semiconductor device according to claim 1, wherein the introducing oxygen and the inert gas into the chamber is performed while a volume ratio of oxygen and the inert gas is controlled.

3. The method of manufacturing the semiconductor device according to claim 1, wherein the introducing oxygen and the inert gas into the chamber introduces the oxygen and the inert gas having a volume ratio of oxygen and the inert gas ranging between 1:30 and 1:40.

4. The method of manufacturing the semiconductor device according to claim 1, further comprising:
  forming an lower electrode over the substrate before the forming the ferroelectric film over the substrate; and
  forming an upper electrode over the substrate.

5. The method of manufacturing the semiconductor device according to claim 1, wherein the introducing oxygen and the inert gas into the chamber is performed until a total pressure of a mixture of oxygen and the inert gas achieves 1 atmosphere or more.

6. The method of manufacturing the semiconductor device according to claim 1, wherein the ferroelectric film is lead zirconium titanate.

7. The method of manufacturing the semiconductor device according to claim 1, wherein the ferroelectric film is formed using at least one of a Physical Vapor Deposition method or a sol-gel method.

8. The method of manufacturing the semiconductor device according to claim 1, wherein the ferroelectric film has a thickness in a range from 50 nm to 300 nm.

9. The method of manufacturing the semiconductor device according to claim 1, wherein the inert gas is argon.

* * * * *